US012620338B2

(12) United States Patent
Kwon

(10) Patent No.: US 12,620,338 B2
(45) Date of Patent: May 5, 2026

(54) DISPLAY DEVICE

(71) Applicant: LG Display Co., Ltd., Seoul (KR)

(72) Inventor: Hoiyong Kwon, Seoul (KR)

(73) Assignee: LG Display Co., Ltd., Seoul (KR)

( * ) Notice: Subject to any disclaimer, the term of this patent is extended or adjusted under 35 U.S.C. 154(b) by 167 days.

(21) Appl. No.: 18/451,571

(22) Filed: Aug. 17, 2023

(65) Prior Publication Data

US 2024/0062699 A1     Feb. 22, 2024

(30) Foreign Application Priority Data

Aug. 18, 2022     (KR) ......................... 10-2022-0103432

(51) Int. Cl.
*G09G 3/20*          (2006.01)
*G02F 1/1335*        (2006.01)
(Continued)

(52) U.S. Cl.
CPC ..... *G09G 3/2074* (2013.01); *G02F 1/133514* (2013.01); *G09G 3/3208* (2013.01);
(Continued)

(58) Field of Classification Search
CPC ............... G09G 3/3677; G09G 3/3696; G09G 2300/0417; G09G 2300/0426;
(Continued)

(56) References Cited

U.S. PATENT DOCUMENTS

| 10,621,893 B2 | 4/2020 | Araki et al. |
| 11,121,204 B2 | 9/2021 | Ohara |
| 11,730,026 B2 | 8/2023 | Jung et al. |
| 2019/0129551 A1* | 5/2019 | Lee ....................... G06F 3/0446 |

(Continued)

FOREIGN PATENT DOCUMENTS

| CN | 113921559 A | 1/2022 |
| KR | 20130066471 A * | 6/2013 |

(Continued)

*Primary Examiner* — Stacy Khoo
(74) *Attorney, Agent, or Firm* — Seed Intellectual Property Law Group LLP

(57)          ABSTRACT

Provided is a display device. The display device comprises a first substrate which includes an active area with a plurality of sub-pixels and a non-active area enclosing the active area and is made of one of transparent conductive oxides or oxide semiconductors, a plurality of signal lines disposed on the first substrate, a pad part disposed on the first substrate in the non-active area, a plurality of link lines which connects the pad part and the plurality of signal lines, a plurality of inorganic insulating layers disposed between the first substrate and the plurality of link lines; and a second substrate disposed on the first substrate and the plurality of link lines, wherein a plurality of first link lines among the plurality of link lines includes a first line pattern connected to the plurality of signal lines, a second line pattern connected to the pad part; and a third line pattern which connects the first line pattern and the second line pattern of the first link line and overlaps a tip end of the second substrate, and the plurality of inorganic insulating layers is disposed except an area where the tip end of the second substrate overlaps the third line pattern of the first link line to improve moisture blocking performance, and suppress the occurrence of cracks in an outer peripheral portion.

22 Claims, 11 Drawing Sheets

100

(51) Int. Cl.

| | |
|---|---|
| *G09G 3/3208* | (2016.01) |
| *G09G 3/34* | (2006.01) |
| *H10K 50/84* | (2023.01) |
| *H10K 102/10* | (2023.01) |

(52) U.S. Cl.
CPC ........... *G09G 3/3406* (2013.01); *H10K 50/84* (2023.02); *G09G 2300/0413* (2013.01); *G09G 2310/0202* (2013.01); *H10K 2102/101* (2023.02)

(58) Field of Classification Search
CPC ....... G09G 2310/0286; G09G 2310/08; G09G 2330/021; H03K 17/161; H03K 3/012
See application file for complete search history.

(56) References Cited

U.S. PATENT DOCUMENTS

| | | | |
|---|---|---|---|
| 2019/0348476 A1* | 11/2019 | Kato | .......................... G09F 9/30 |
| 2020/0264342 A1 | 8/2020 | Suzuki | |
| 2021/0296426 A1 | 9/2021 | Saitoh et al. | |
| 2023/0110850 A1* | 4/2023 | Wang | ................... H10K 59/131 |
| | | | 257/72 |
| 2023/0148430 A1* | 5/2023 | Kim | .................... H10H 29/142 |
| | | | 257/89 |
| 2024/0013717 A1* | 1/2024 | Lee | .................... H01L 25/0753 |

FOREIGN PATENT DOCUMENTS

| | | |
|---|---|---|
| KR | 10-2013-0072628 A | 7/2013 |
| KR | 10-2019-0037380 A | 4/2019 |
| KR | 10-2019-0071970 A | 6/2019 |
| KR | 20190081853 A | 7/2019 |
| WO | WO 2018142739 A1 | 8/2018 |

* cited by examiner

CF(CFR,CFG,CFB)
DL(DL1,DL2,DL3,DL4)
DP(TR1,TR2,TR3,SC)

DISPLAY DEVICE

CROSS-REFERENCE TO RELATED APPLICATIONS

This application claims the priority of Korean Patent Application No. 10-2022-0103432 filed on Aug. 18, 2022, in the Korean Intellectual Property Office, the disclosure of which is incorporated herein by reference.

BACKGROUND

Technical Field

The present disclosure relates to a display device that improves moisture blocking performance, and suppresses the occurrence of cracks in an outer peripheral portion.

Description of the Related Art

Display devices used for a monitor of a computer, a television, or a cellular phone include an organic light emitting display device (OLED) and a liquid crystal display device (LCD). The OLED is a self-emitting device, and the LCD requires a separate light source.

Display devices have a wide range of diverse applications, including personal digital assistants, as well as monitors of computers and televisions. A display device with a large display area, and reduced volume and weight is being studied.

Recently, a flexible display device has attracted attention as a next-generation display device. In the flexible display device, display elements and lines are formed on a flexible substrate made of flexible plastic, and the flexible display device may display an image even when folded or rolled.

BRIEF SUMMARY

The present disclosure is directed to a display device which does not use a plastic substrate and thus improves moisture blocking performance, and suppresses the occurrence of cracks in an outer peripheral portion.

An implementation of the present disclosure provides a display device, which uses, as a substrate, one of a transparent conductive oxide layer and an oxide semiconductor layer instead of a plastic substrate.

An implementation of the present disclosure provides a display device, which suppresses the occurrence of cracks in a first substrate and a plurality of inorganic insulating layers. The cracks may occur in a part of an outer peripheral portion of the display device where a flexible film is disposed.

An implementation of the present disclosure provides a display device which suppresses the occurrence of cracks in a link line and the propagation of cracks.

Technical features and benefits of the present disclosure are not limited to those mentioned above, and other technical features and benefits, which are not mentioned above, can be clearly understood by those skilled in the art from the following descriptions.

According to an aspect of the present disclosure, there is provided a display device. The display device comprises a first substrate which includes an active area with a plurality of sub-pixels and a non-active area enclosing the active area and is made of one of transparent conductive oxides or oxide semiconductors, a plurality of signal lines disposed on the first substrate, a pad part disposed on the first substrate in the non-active area, a plurality of link lines which connects the pad part and the plurality of signal lines, a plurality of inorganic insulating layers disposed between the first substrate and the plurality of link lines; and a second substrate disposed on the first substrate and the plurality of link lines, wherein a plurality of first link lines among the plurality of link lines includes a first line pattern connected to the plurality of signal lines, a second line pattern connected to the pad part; and a third line pattern which connects the first line pattern and the second line pattern of the first link line and overlaps a tip end of the second substrate, and the plurality of inorganic insulating layers is disposed except an area where the tip end of the second substrate overlaps the third line pattern of the first link line to improve moisture blocking performance, and suppress the occurrence of cracks in an outer peripheral portion.

According to another aspect of the present disclosure, there is provided a display device. The display device comprises a first substrate which includes an active area and a non-active area enclosing the active area and is made of one of transparent conductive oxides or oxide semiconductors, a plurality of signal lines disposed on the first substrate in the active area, a plurality of link lines connected to the plurality of signal lines and disposed extending to the non-active area, a pad part connected to the plurality of link lines in the non-active area, a plurality of inorganic insulating layers disposed to overlap the plurality of link lines on the first substrate, a second substrate disposed on the first substrate, and a filling layer disposed in an area overlapping a tip end of the second substrate on the first substrate, wherein a plurality of first link lines among the plurality of link lines includes a first line pattern disposed adjacent to the active area, a second line pattern spaced apart from the first line pattern and disposed close to an outer periphery of the first substrate; and a third line pattern which connects the first line pattern and the second line pattern of the first link line, and the filling layer is disposed in an area where the tip end of the second substrate overlaps the third line pattern of the first link line to suppress the occurrence of cracks in a link line and the propagation of cracks.

Other detailed matters of the example embodiments are included in the detailed description and the drawings.

According to the present disclosure, a display device uses a transparent conductive oxide layer and an oxide semiconductor layer as a substrate. Thus, it is possible to easily control moisture permeance and also possible to enhance flexibility.

According to the present disclosure, it is possible to suppress the occurrence of cracks of an inorganic layer and a first substrate from the side of an outer peripheral portion of the display device where a flexible film is disposed. Thus, it is possible to improve the reliability of the display device.

According to the present disclosure, a filling layer is disposed to overlap the first substrate. Thus, it is possible to suppress a short-circuit of a link line.

The effects according to the present disclosure are not limited to the contents described above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
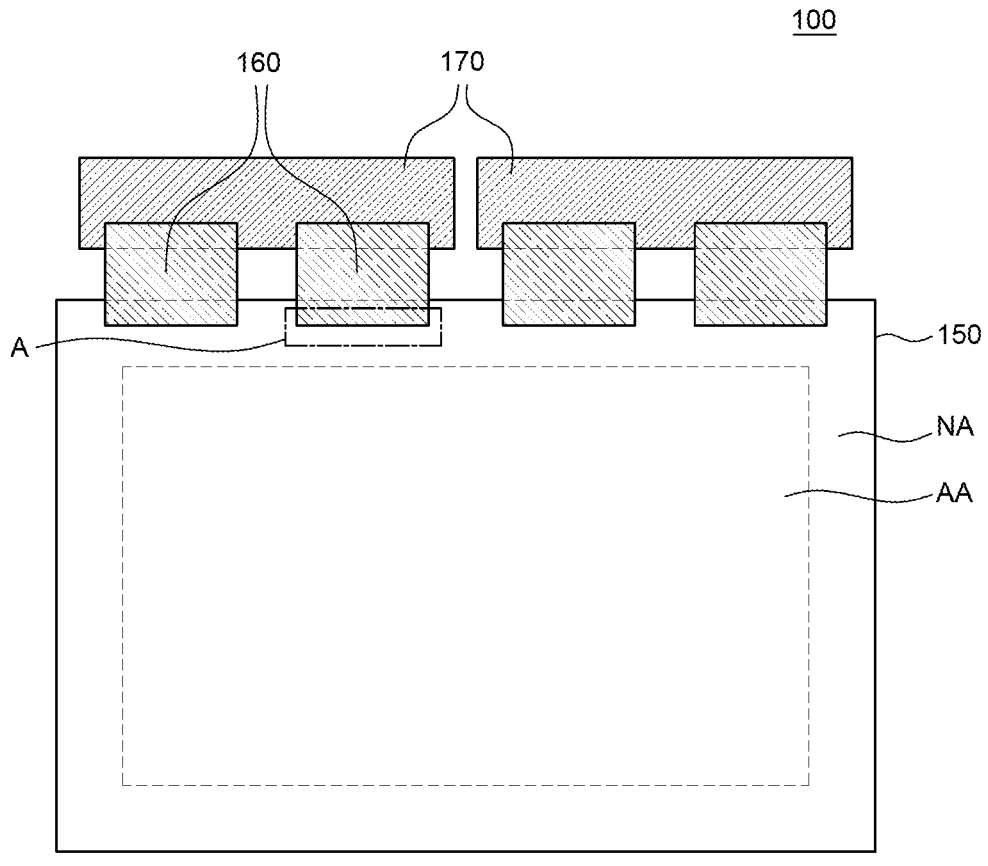
FIG. 1 is a plan view of a display device according to an example embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components.

Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to example embodiments of the present disclosure will be described in detail with reference to accompanying drawings.

Figure 2:
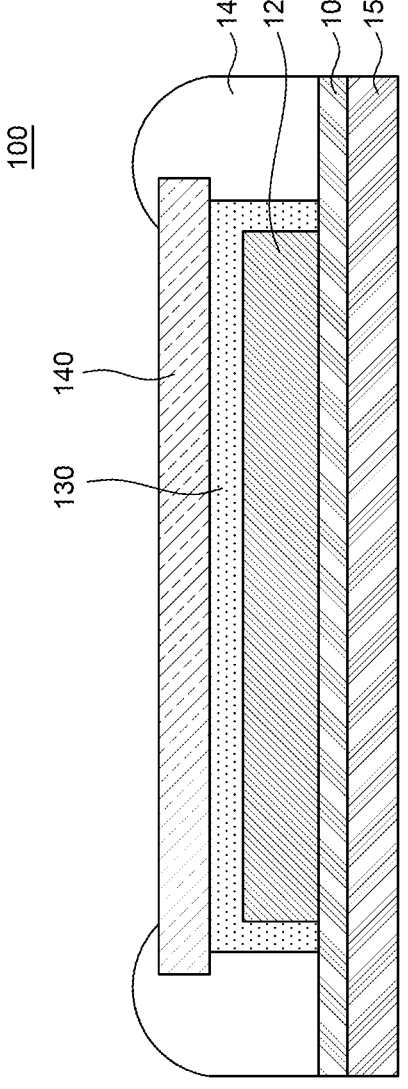
FIG. 2 is a schematical cross-sectional view of the display device according to an example embodiment of the present disclosure.

FIG. 1 is a plan view of a display device according to an example embodiment of the present disclosure. FIG. 2 is a schematical cross-sectional view of the display device according to an example embodiment of the present disclosure. FIG. 1 illustrates only a polarization plate 150, a plurality of flexible films 160, and a plurality of printed circuit boards 170 among various components of a display device 100 for the convenience of description.

Referring to FIG. 1 and FIG. 2, a first substrate 101 may be disposed on the polarization plate 150. The first substrate 101 is a support member for supporting other components of the display device 100. The first substrate 101 may be made of any one of transparent conductive oxides and oxide semiconductors. For example, the first substrate 101 may be made of a transparent conductive oxide (TCO), such as indium tin oxide (ITO), indium zinc oxide (IZO), or indium tin zinc oxide (ITZO).

Also, the first substrate 101 may be made of an oxide semiconductor material composed of indium (In) and gallium (Ga). For example, the first substrate 101 may be made of a transparent oxide semiconductor, such as indium gallium zinc oxide (IGZO), indium gallium oxide (IGO), or indium tin zinc oxide (ITZO). However, the material types of the transparent conductive oxide and the oxide semiconductor are merely examples. The first substrate 101 may be made of other transparent conductive oxides and oxide semiconductor materials which are not described in the present disclosure. However, the present disclosure is not limited thereto.

Meanwhile, the first substrate 101 may be formed by depositing a transparent conductive oxide or an oxide semiconductor with a very small thickness. Accordingly, the first substrate 101 may be formed with a very small thickness to have flexibility. The display device 100 including the first substrate 101 having flexibility may be implemented as a flexible display device 100 capable of displaying an image even when folded or rolled. For example, when the display device 100 is a foldable display device, the first substrate 101 may be folded or unfolded with respect to a folding axis. As another example, when the display device 100 is a rollable display device, the display device may be rolled and stored on a roller. Accordingly, the display device 100 according to an example embodiment of the present disclosure may be implemented as a flexible display device 100 such as a foldable display device or a rollable display device using the first substrate 101 having flexibility.

Also, as for the display device 100 according to an example embodiment of the present disclosure, a laser lift off (LLO) process may be performed on the first substrate 101 made of a transparent conductive oxide or an oxide semiconductor. The LLO process refers to a process of separating a temporary substrate under the first substrate 101 from the first substrate 101 using a laser during a process of manufacturing the display device 100. Accordingly, since the first substrate 101 serves to facilitate the LLO process, the first substrate 101 may also be referred to as a functional thin film, a functional thin film layer, a functional substrate, or the like. The LLO process will be described later in more detail.

The display device 100 includes an active area AA and a non-active area NA.

The active area AA is an area where an image is displayed. A pixel unit 120 including a plurality of sub-pixels may be disposed in the active area AA to display an image. For example, the pixel unit 120 may be composed of a plurality of sub-pixels including a light emitting diode and a driving circuit to display an image.

The non-active area NA is an area where an image is not displayed. In the non-active area NA, various lines, driving ICs, and the like are disposed to drive the sub-pixels disposed in the active area AA. For example, various driving ICs such as a gate driver IC and a data driver IC may be disposed in the non-active area NA.

The plurality of flexible films 160 is disposed at one end of the first substrate 101. The plurality of flexible films 160 is electrically connected to one end of the first substrate 101. The plurality of flexible films 160 includes various components disposed on a flexible base film and serves to supply signals to the plurality of sub-pixels in the active area AA. One end of the plurality of flexible films 160 may be disposed in the non-active area NA to supply a data voltage or the like to the plurality of sub-pixels in the active area AA. Meanwhile, FIG. 1 illustrates four flexible films 160. However, the number of flexible films 160 may vary depending on design choice, and is not limited thereto.

Meanwhile, the driving ICs such as a gate driver IC and a data driver IC may be disposed on the plurality of flexible films 160. The driving IC is configured to process data for displaying an image and a driving signal for processing the data. The driving IC may be disposed by a chip on glass (COG), a chip on film (COF), or a tape carrier package (TCP) technique depending on a mounting method. In the present disclosure, for the convenience of description, the driving IC is described, for example, as being mounted on the plurality of flexible films 160 by the COF technique, but is not limited thereto.

The printed circuit board 170 is connected to the plurality of flexible films 160. The printed circuit board 170 serves to supply a signal to the driving IC. In the printed circuit board 170, various components for supplying various driving signals such as a driving signal, and a data voltage to the driving ICs may be disposed. Meanwhile, FIG. 1 illustrates two printed circuit boards 170. However, the number of printed circuit boards 170 may vary depending on design choice, and is not limited thereto.

Although not shown in FIG. 2, a plurality of inorganic insulating layers is disposed on the first substrate 101. The plurality of inorganic insulating layers may be a plurality of inorganic layers including a lower buffer layer, an upper buffer layer, a gate insulating layer, and a first passivation layer to be described later. The plurality of inorganic insulating layers will be described in detail with reference to FIG. 4 through FIG. 8.

The pixel unit 120 is disposed on the plurality of inorganic insulating layers. The pixel unit 120 may be disposed corresponding to the active area AA. The pixel unit 120 includes the plurality of sub-pixels to display an image. The plurality of sub-pixels of the pixel unit 120 is a minimum unit constituting the active area AA, and a light emitting diode and a driving circuit may be disposed in each of the plurality of sub-pixels. For example, the light emitting diode in each of the plurality of sub-pixels may include an organic light emitting diode including an anode, an organic emission layer, and a cathode. Also, the light emitting diode may include an LED including N-type and P-type semiconductor layers and an emission layer, or the like. However, the present disclosure is not limited thereto. Further, the driving circuit for driving the plurality of sub-pixels may include driving elements such as a thin film transistor and a storage capacitor, but is not limited thereto. Hereinafter, for the convenience of description, the light emitting diode in each of the plurality of sub-pixels will be described as an organic light emitting diode, but is not limited thereto.

Meanwhile, the display device 100 may be configured as a top emission type or a bottom emission type depending on a direction in which light is emitted from the light emitting diode.

In the top emission type, light emitted from the light emitting diode is output toward an upper part of the first substrate 101 on which the light emitting diode is disposed. In the top emission type, a reflection layer may be disposed under the anode to allow light emitted from the light emitting diode to travel toward the upper part of the first substrate 101, i.e., toward the cathode.

In the bottom emission type, light emitted from the light emitting diode is output toward a lower part of the first substrate 101 on which the light emitting diode is disposed. In the bottom emission type, the anode may be made of only a transparent conductive material to allow light emitted from the light emitting diode to travel toward the lower part of the first substrate 101. Also, the cathode may be made of a metal material having high reflectance.

Hereinafter, for the convenience of description, the display device 100 according to an example embodiment of the present disclosure will be described as being of a bottom emission type, but is not limited thereto.

An adhesive layer may be disposed to cover the pixel unit 120. The adhesive layer 130 may serve to attach the first substrate 101 to a second substrate 140 and seal the pixel unit 120 to protect the light emitting diode of the pixel unit 120 from external moisture, oxygen, impacts, etc. The adhesive layer 130 may have a face-seal structure. For example, the adhesive layer 130 may be formed by forming an ultraviolet-curing or thermosetting sealant on the entire surface of the pixel unit 120. However, the adhesive layer 130 may have various structures and may be made of various materials, and is not limited thereto.

Meanwhile, the second substrate 140 made of a metal material having a high modulus and a high corrosion resistance may be disposed on the adhesive layer 130. For example, the second substrate 140 may be made of a material which has a high modulus of about 200 MPa to about 900 MPa. Also, the second substrate 140 may be made of a metal material, which has a high corrosion resistance and may be easily processed in the form of foil or thin film, such as aluminum (Al), nickel (Ni), chromium (Cr), or an alloy of iron (Fe) and Ni. Therefore, if the second substrate 140 is made of a metal material, it may be implemented as an ultra-thin film and have a high resistance to external impacts and scratches.

A seal member 141 is disposed to enclose respective side surfaces of the pixel unit 120, the adhesive layer 130, and the second substrate 140. The seal member 141 may be disposed in the non-active area NA to enclose the pixel unit 120 disposed in the active area AA. The seal member 141 may be disposed to enclose a side surface of the pixel unit 120, a side surface of the adhesive layer 130, and a side surface of the second substrate 140. Thus, it is possible to minimize moisture permeation into the pixel unit 120.

The seal member 141 may be made of a non-conductive material having elasticity to enhance the rigidity of the side surface of the display device 100 while sealing the side surface of the pixel unit 120. Also, the seal member 141 may be made of a material having adhesiveness. Further, the seal member 141 may further include a getter to minimize moisture permeation through the side of the display device 100 by absorbing moisture, oxygen, and the like from the outside. For example, the seal member 141 may be made of a polyimide (PI)-, polyurethane-, epoxy-, or acryl-based material, but is not limited thereto.

A polarization plate 150 is disposed under the first substrate 101. The polarization plate 150 serves to selectively transmit light and thus may suppress reflection of external light incident onto the first substrate 101. For example, in the display device 100, various metal materials used for semiconductor elements, lines, light emitting diodes, etc., are disposed on the first substrate 101. Thus, external light incident onto the first substrate 101 may be reflected by the metal materials. Also, reflection of external light may cause degradation of visibility of the display device 100. Therefore, the polarization plate 150 configured to suppress reflection of external light is disposed under the first substrate 101 in order to enhance outdoor visibility of the display device 100. However, the polarization plate 150 may be omitted in some example embodiments of the display device 100.

Meanwhile, although not shown in the drawings, a barrier film may also be disposed under the first substrate 101 in addition to the polarization plate 150. The barrier film may minimize the permeation of external moisture or oxygen into the first substrate 101 from the outside of the first substrate 101 and thus protect the pixel unit 120 including light emitting diodes. However, the barrier film may be omitted in some example embodiments of the display device 100, and is not limited thereto.

Hereinafter, the plurality of sub-pixels of the pixel unit 120 will be described in more detail with reference to FIG. 3 through FIG. 5.

Figure 3:
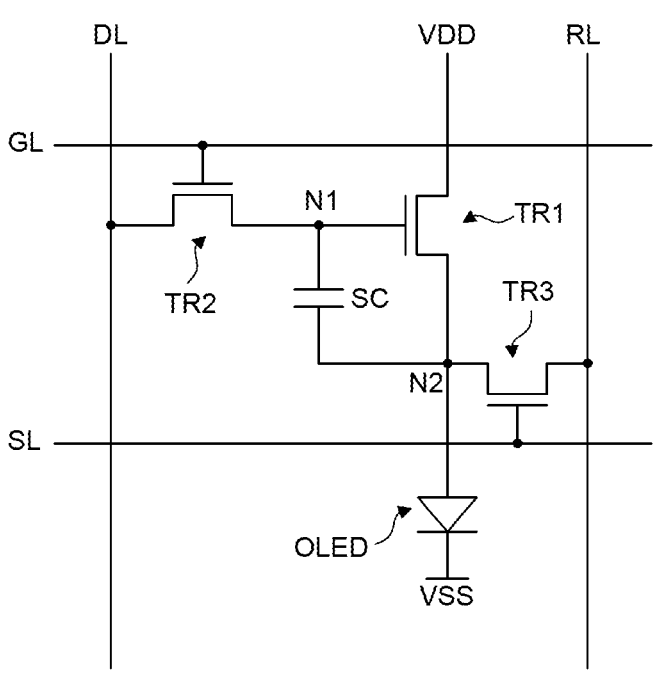
FIG. 3 is a circuit diagram of a sub-pixel of the display device according to an example embodiment of the present disclosure.

FIG. 3 is a circuit diagram of a sub-pixel of the display device according to an example embodiment of the present disclosure.

Referring to FIG. 3, a driving circuit for driving a light emitting element OLED in each of a plurality of sub-pixels SP may include a first transistor TR1, a second transistor TR2, a third transistor TR3, and a storage capacitor SC. Also, a plurality of signal lines for driving the driving circuit is disposed on the first substrate 101. The plurality of signal lines includes a gate line GL, a data line DL, a high potential power line VDD, a sensing line SL, and a reference line RL.

Each of the first transistor TR1, the second transistor TR2, and the third transistor TR3 included in the driving circuit of the sub-pixel SP may include a gate electrode, a source electrode, and a drain electrode.

Further, each of the first transistor TR1, the second transistor TR2, and the third transistor TR3 may be a P-type thin film transistor or an N-type thin film transistor. For example, in the P-type thin film transistor, holes flow from the source electrode to the drain electrode, and thus, a current may flow from the source electrode to the drain electrode. In the N-type thin film transistor, electrons flow from the source electrode to the drain electrode, and thus, the current may flow from the drain electrode to the source electrode. Hereinafter, the first transistor TR1, the second transistor TR2, and the third transistor TR3 will be described as the N-type thin film transistors in which the current flows from the drain electrode to the source electrode. However, the present disclosure is not limited thereto.

The first transistor TR1 includes a first gate electrode, a first source electrode, and a first drain electrode. The first gate electrode is connected to a first node N1, the first source electrode is connected to an anode of the light emitting element OLED, and the first drain electrode is connected to the high potential power line VDD. The first transistor TR1 may be turned on when a voltage of the first node N1 is higher than a threshold voltage, and may be turned off when the voltage of the first node N1 is lower than the threshold voltage. Also, when the first transistor TR1 is turned on, a driving current may be transferred to the light emitting element OLED through the first transistor TR1. Accordingly, the first transistor TR1 controlling the driving current transmitted to the light emitting element OLED may also be referred to as a driving transistor.

The second transistor TR2 includes a second gate electrode, a second source electrode, and a second drain electrode. The second gate electrode is connected to the gate line GL, the second source electrode is connected to the first node N1, and the second drain electrode is connected to the data line DL. The second transistor TR2 may be turned on or off based on a gate voltage from the gate line GL. When the second transistor TR2 is turned on, a data voltage from the data line DL may be charged in the first node N1. Accordingly, the second transistor TR2 turned on or off by the gate line GL may also be referred to as a switching transistor.

The third transistor TR3 includes a third gate electrode, a third source electrode, and a third drain electrode. The third gate electrode is connected to the sensing line SL, the third source electrode is connected to a second node N2, and the third drain electrode is connected to the reference line RL. The third transistor TR3 may be turned on or off based on a sensing voltage from the sensing line SL. Also, when the third transistor TR3 is turned on, a reference voltage from the reference line RL may be transmitted to the second node N2 and the storage capacitor SC. Accordingly, the third transistor TR3 may also be referred to as a sensing transistor.

Meanwhile, although the gate line GL and the sensing line SL are illustrated as separate lines in FIG. 3, the gate line GL and the sensing line SL may be implemented as a single line, but are not limited thereto.

The storage capacitor SC is connected between the first gate electrode and the first source electrode of the first transistor TR1. That is, the storage capacitor SC may be connected between the first node N1 and the second node N2. The storage capacitor SC maintains a potential difference between the first gate electrode and the first source electrode of the first transistor TR1 while the light emitting element OLED emits light. Thus, the storage capacitor SC supplies a constant driving current to the light emitting element OLED. The storage capacitor SC includes a plurality of capacitor electrodes. For example, one of the plurality of capacitor electrodes may be connected to the first node N1, and the other capacitor electrode may be connected to the second node N2.

The light emitting element OLED includes an anode, an emission layer, and a cathode. The anode of the light emitting element OLED is connected to the second node N2, and the cathode is connected to a low potential power line VSS. The light emitting element OLED may receive the driving current from the first transistor TR1 to emit light.

Meanwhile, FIG. 3 illustrates that the driving circuit of the sub-pixel SP of the display device 100 according to an example embodiment of the present disclosure has a 3T1C structure including three transistors and one storage capacitor SC. However, the number and the connection relationship of the transistors and the storage capacitor SC may vary depending on design choice, but are not limited thereto.

Figure 4:
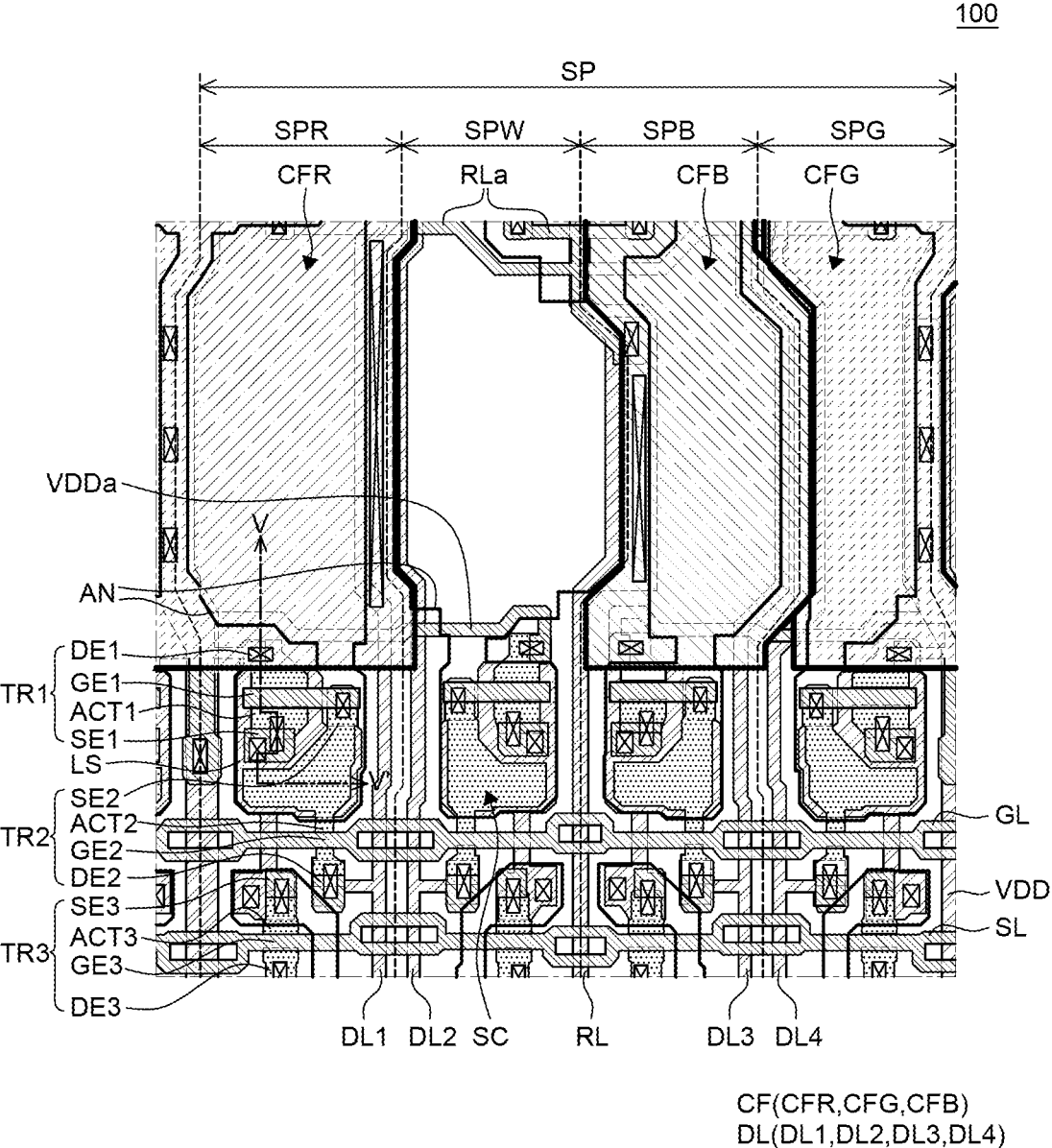
FIG. 4 is an enlarged plan view of the display device according to an example embodiment of the present disclosure.
Figure 6:
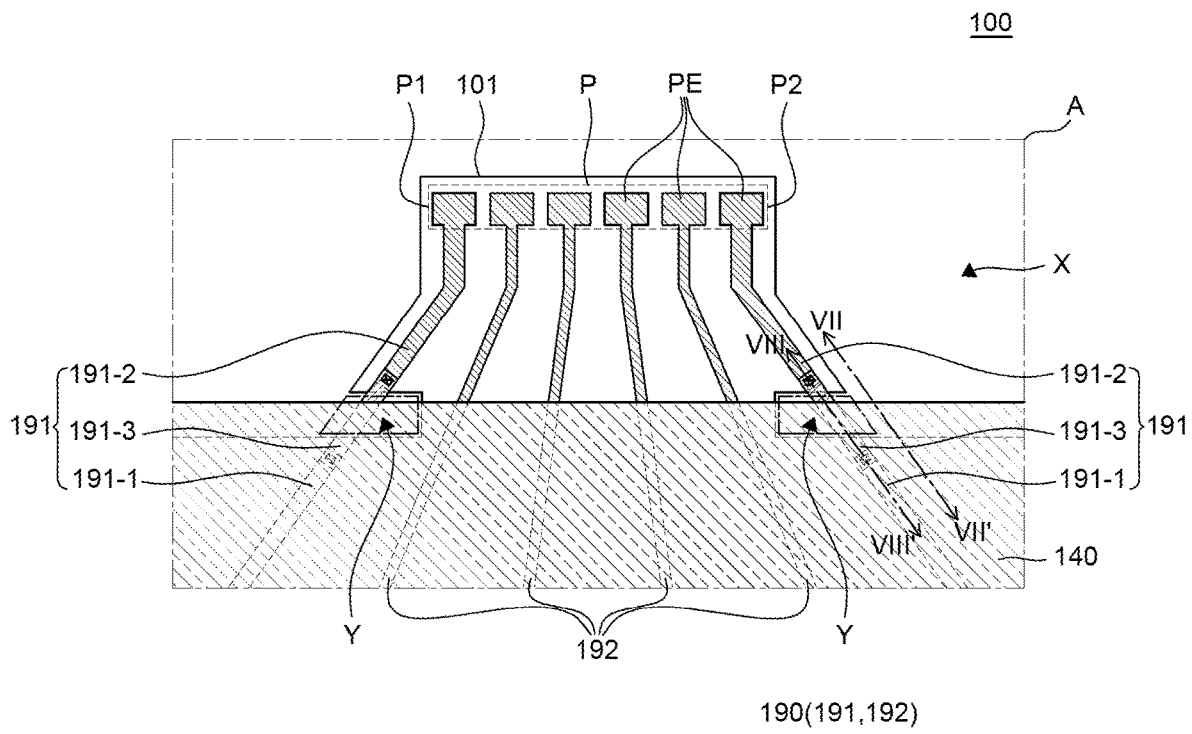
FIG. 6 is an enlarged view showing a portion A of FIG. 1.
Figure 7:
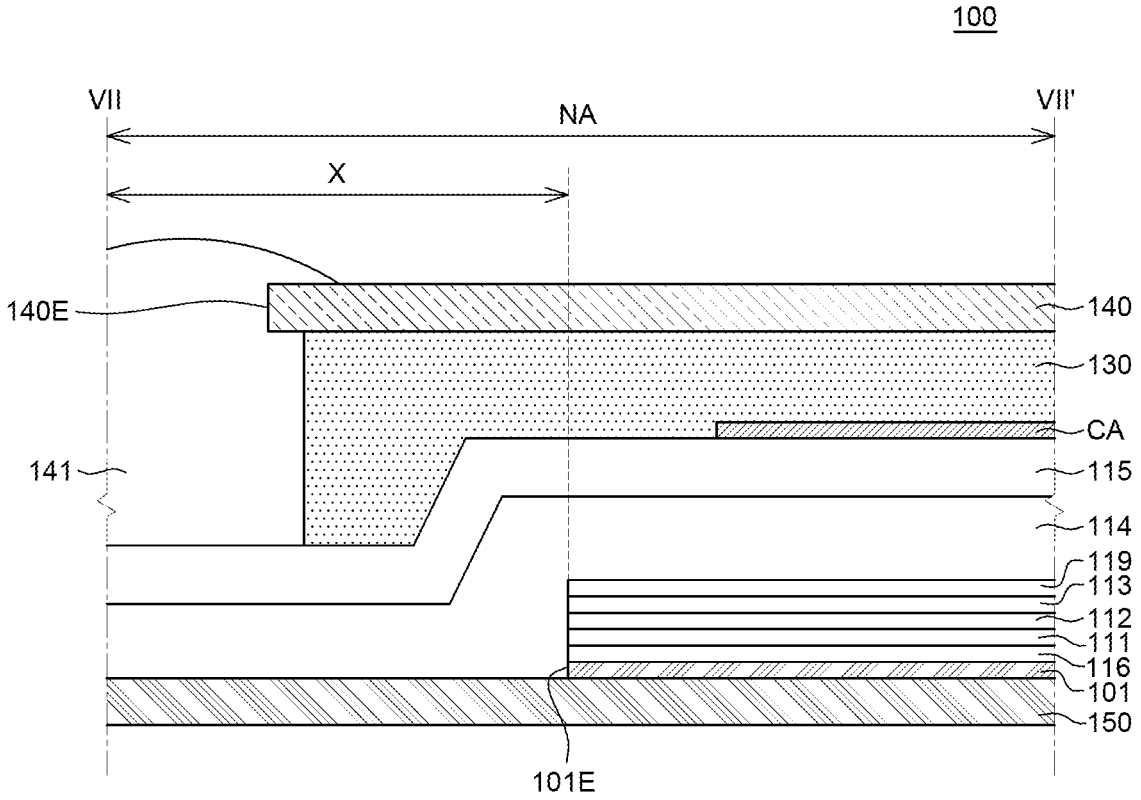
FIG. 7 is a cross-sectional view as taken along a line VII-VII' of FIG. 6.
Figure 8:
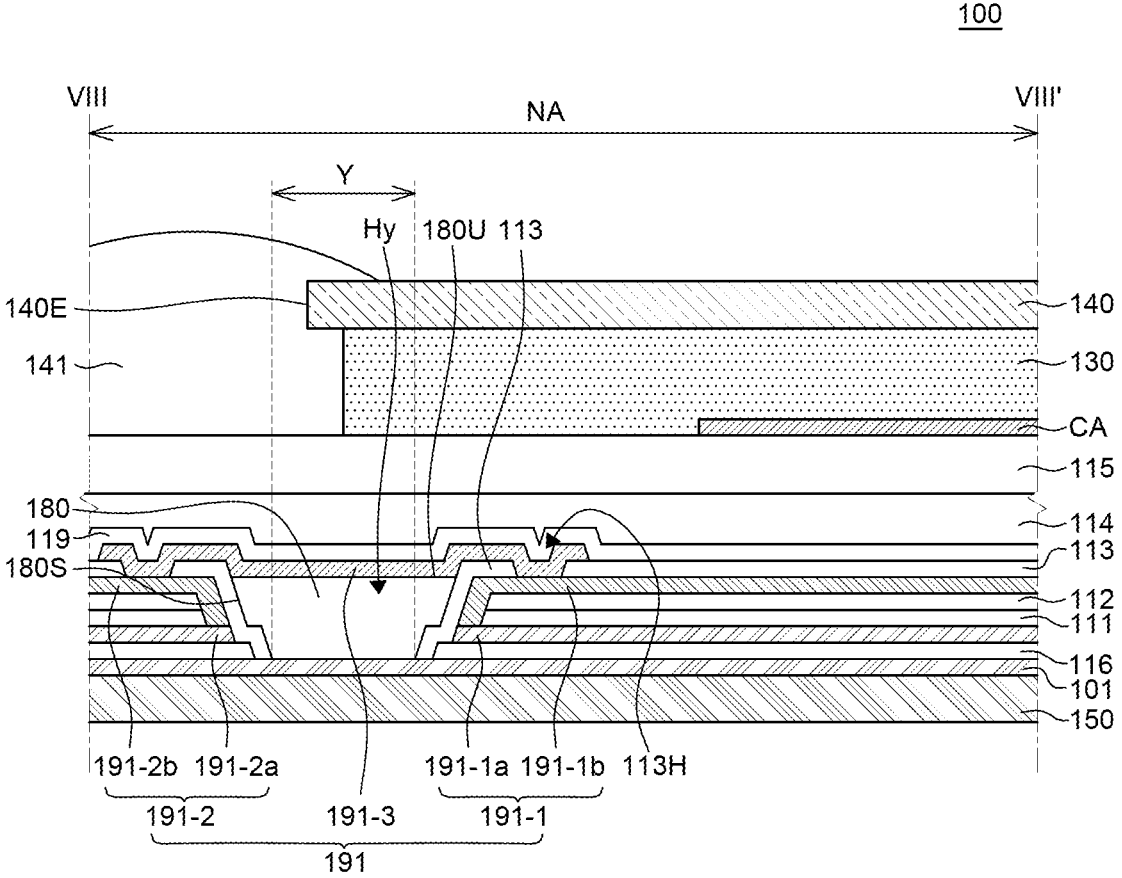
FIG. 8 is a cross-sectional view as taken along a line VIII-VIII' of FIG. 6.

FIG. 4 is an enlarged plan view of the display device according to an example embodiment of the present disclosure. FIG. 5 is a cross-sectional view as taken along a line V-V' of FIG. 4. FIG. 6 is an enlarged view showing a portion A of FIG. 1. FIG. 7 is a cross-sectional view as taken along a line VII-VII' of FIG. 6. FIG. 8 is a cross-sectional view as taken along a line VIII-VIII' of FIG. 6. FIG. 4 is an enlarged plan view of a red sub-pixel SPR, a white sub-pixel SPW, a blue sub-pixel SPB, and a green sub-pixel SPG included in one pixel. In FIG. 4, for the convenience of description, the bank 115 has been omitted, and a plurality of color filters CF is illustrated by thick solid lines. FIG. 6 illustrates only a part of the first substrate 101, a pad part P, a pad electrode PE, a plurality of link lines 190, and the second substrate 140 for the convenience of description, and for the convenience of description, flexible films 160 have been omitted. FIG. 6 is a plan view of the pad part P corresponding to one flexible film 160. FIG. 7 is a cross-sectional view of a region where no link line 190 is disposed. FIG. 8 is a cross-sectional view of a region where the link line 190 is disposed.

Referring to FIG. 4 through FIG. 8, the display device 100 according to an example embodiment of the present disclosure includes the first substrate 101, a plurality of inorganic insulating layers, and a planarization layer 114. Also, the display device 100 includes a bank 115, the first transistor TR1, the second transistor TR2, the third transistor TR3, the storage capacitor SC, the light emitting element OLED, the gate line GL, the sensing line SL, and the data line DL. Further, the display device 100 includes the reference line RL, the high potential power line VDD, the plurality of color filters CF, the plurality of link lines 190, a filling layer 180, the adhesive layer 130, and the second substrate 140.

Referring to FIG. 4, the plurality of sub-pixels SP includes a red sub-pixel SPR, a green sub-pixel SPG, a blue sub-pixel SPB, and a white sub-pixel SPW. For example, the red sub-pixel SPR, the white sub-pixel SPW, the blue sub-pixel SPB, and the green sub-pixel SPG may be sequentially disposed along a row direction. However, the arrangement order of the plurality of sub-pixels SP is not limited thereto.

Each of the plurality of sub-pixels SP includes an emission area and a circuit area. The emission area is an area where one color light is independently emitted and the light emitting element OLED may be disposed. For example, the emission area may be an area which is exposed by the bank 115 in an overlap area between the plurality of color filters CF and an anode AN and allows light emitted from the light emitting element OLED to proceed to the outside. For example, referring to FIG. 4 and FIG. 5, an emission area of the red sub-pixel SPR is an area exposed by the bank 115 in an overlap area between a red color filter CFR and an anode AN. Also, an emission area of the green sub-pixel SPG is an area exposed by the bank 115 in an overlap area between a green color filter CFG and the anode AN. Further, an emission area of the blue sub-pixel SPB is an area which is exposed by the bank 115 in an overlap area between a blue color filter CFB and the anode AN and emits blue light. Herein, an emission area of the white sub-pixel SPW where any color filter CF is not disposed may be an area which overlaps a part of the anode AN exposed by the bank 115 and emits white light.

The circuit area is an area except the emission area. A driving circuit DP for driving a plurality of light emitting diodes OLED and a plurality of lines for transmitting various signals to the driving circuit DP may be disposed in the circuit area. The circuit area where the driving circuit DP, the plurality of lines, and the bank 115 are disposed may be a non-emission area. For example, in the circuit area, the driving circuit DP including the first transistor TR1, the second transistor TR2, the third transistor TR3, and the storage capacitor SC may be disposed. Also, in the circuit area, a plurality of high potential power lines VDD, a plurality of data lines DL, a plurality of reference lines RL, a plurality of gate lines GL, the sensing line SL, and the bank 115 may be disposed.

Referring to FIG. 3 through FIG. 8, the plurality of inorganic insulating layers is disposed on the first substrate 101. The plurality of inorganic insulating layers may include a plurality of layers made of an inorganic material disposed on the first substrate 101. For example, the plurality of inorganic insulating layers may include a lower buffer layer 116, an upper buffer layer 111, a gate insulating layer 112, and a first passivation layer 113, but is not limited thereto.

The lower buffer layer 116 is disposed on the first substrate 101. The lower buffer layer 116 may suppress the diffusion of moisture and/or oxygen permeating from the outside of the first substrate 101. The moisture blocking performance of the display device 100 may be controlled by controlling the thickness or laminated structure of the lower buffer layer 116. Also, the lower buffer layer 116 may suppress a short-circuit occurring when the first substrate 101 made of a transparent conductive oxide or an oxide semiconductor comes into contact with other components such as the pixel unit 120. The lower buffer layer 116 may be made of an inorganic material. For example, the lower buffer layer 116 may be formed as a single layer or a multilayer of silicon oxide (SiOx) or silicon nitride (SiNx), but is not limited thereto.

A plurality of high potential power lines VDD, a plurality of data lines DL, a plurality of reference lines RL, and a light shielding layer LS are disposed on the lower buffer layer 116.

The plurality of high potential power lines VDD, the plurality of data lines DL, the plurality of reference lines RL, and the light shielding layer LS may be disposed on the same layer on the first substrate 101. Also, the plurality of high potential power lines VDD, the plurality of data lines DL, the plurality of reference lines RL, and the light shielding layer LS may be made of the same conductive material. For example, the conductive material may include copper (Cu), aluminum (Al), molybdenum (Mo), nickel (Ni), titanium (Ti), chromium (Cr), or an alloy thereof, but is not limited thereto.

The plurality of high potential power lines VDD serves to transmit a high potential power voltage to each of the plurality of sub-pixels SP. The plurality of high potential power lines VDD may extend in a column direction between the plurality of sub-pixels SP, and two sub-pixels SP adjacent to each other in the row direction may share one of the plurality of high potential power lines VDD. For example, one high potential power line VDD may be disposed on the left of the red sub-pixel SPR and may supply the high potential power voltage to each of the first transistors TR1 of the red sub-pixel SPR and the white sub-pixel SPW. Another high potential power line VDD may be disposed on the right of the green sub-pixel SPG and may supply the high potential power voltage to each of the first transistors TR1 of the blue sub-pixel SPB and the green sub-pixel SPG.

The plurality of data lines DL extends in the column direction between the plurality of sub-pixels SP and transmits a data voltage to each of the plurality of sub-pixels SP. The plurality of data lines DL includes a first data line DL1, a second data line DL2, a third data line DL3, and a fourth data line DL4. The first data line DL1 may be disposed between the red sub-pixel SPR and the white sub-pixel SPW and may transmit the data voltage to the second transistor TR2 of the red sub-pixel SPR. The second data line DL2 may be disposed between the first data line DL1 and the white sub-pixel SPW and may transmit the data voltage to the second transistor TR2 of the white sub-pixel SPW. The third data line DL3 may be disposed between the blue sub-pixel SPB and the green sub-pixel SPB and may transmit the data voltage to the second transistor TR2 of the blue sub-pixel SPB. The fourth data line DL4 may be disposed between the third data line DL3 and the green sub-pixel SPG and may transmit the data voltage to the second transistor TR2 of the green sub-pixel SPG.

The plurality of reference lines RL extends in the column direction between the plurality of sub-pixels SP and transmits a reference voltage to each of the plurality of sub-pixels SP. The plurality of sub-pixels SP forming a pixel may share one reference line RL. For example, the reference line RL may be disposed between the white sub-pixel SPW and the blue sub-pixel SPB. Also, the reference line RL may transmit the reference voltage to each of the third transistors TR3 of the red sub-pixel SPR, the white sub-pixel SPW, the blue sub-pixel SPB, and the green sub-pixel SPG.

Figure 5:
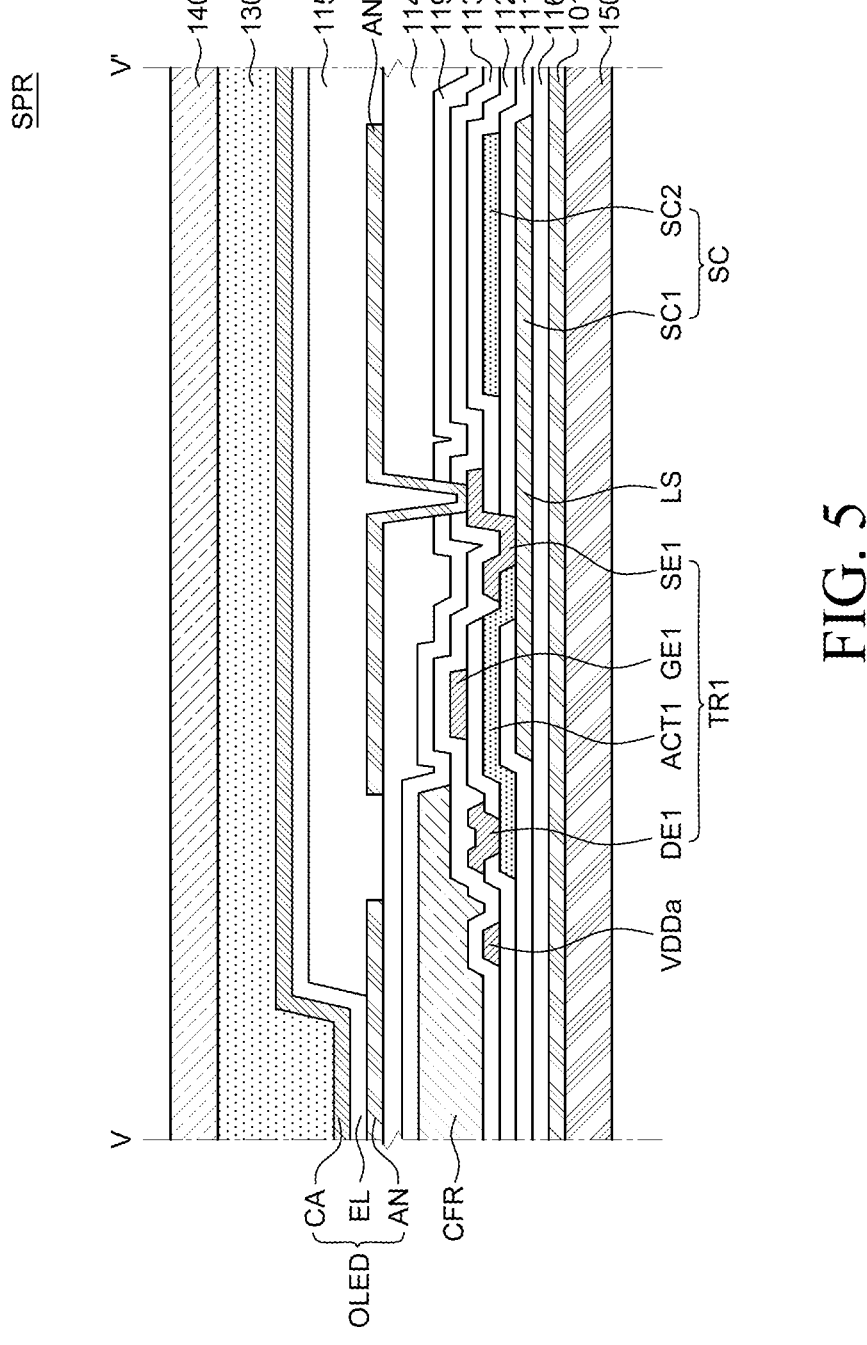
FIG. 5 is a cross-sectional view as taken along a line V-V' of FIG. 4.

Referring to FIG. 4 and FIG. 5, the light shielding layer LS is disposed on the lower buffer layer 116. The light shielding layer LS may be disposed in contact with at least a first active layer ACT1 of the first transistor TR1 among the plurality of transistors TR1, TR2 and TR3, and may block light incident onto the first active layer ACT1. When light is irradiated to the first active layer ACT1, a leakage current is generated. Thus, the reliability of the first transistor TR1 serving as a driving transistor may be degraded. Herein, the light shielding layer LS is made of an opaque conductive material such as copper (Cu), aluminum (Al), molybdenum (Mo), nickel (Ni), titanium (Ti), chromium (Cr), or an alloy thereof. If the light shielding layer LS is disposed to overlap the first active layer ACT1, the light shielding layer LS may block light incident onto the first active layer ACT1 from below the first substrate 101. Thus, the reliability of the first transistor TR1 may be improved. However, the present disclosure is not limited thereto. The light shielding layer LS may also be disposed to overlap a second active layer ACT2 of the second transistor TR2 and a third active layer ACT3 of the third transistor TR3.

Meanwhile, the light shielding layer LS is illustrated as a single layer, but the light shielding layer LS may be composed of a plurality of layers. For example, the light shielding layer LS may be composed of a plurality of layers disposed to overlap with at least one of the plurality of inorganic insulating layers interposed therebetween. The plurality of inorganic insulating layers includes the lower buffer layer 116, the upper buffer layer 111, the gate insulating layer 112, and the first passivation layer 113.

The upper buffer layer 111 is disposed on the plurality of high potential power lines VDD, the plurality of data lines DL, the plurality of reference lines RL, and the light shielding layer LS. The upper buffer layer 111 may suppress the permeation of moisture or impurities through the first substrate 101. For example, the upper buffer layer 111 may be formed as a single layer or a multilayer of silicon oxide (SiOx) or silicon nitride (SiNx), but is not limited thereto. However, the upper buffer layer 111 may be omitted depending on the type of the first substrate 101 or the type of the thin film transistor, but is not limited thereto.

The first transistor TR1, the second transistor TR2, the third transistor TR3, and the storage capacitor SC are disposed on the upper buffer layer 111 in each of the plurality of sub-pixels SP.

The first transistor TR1 includes the first active layer ACT1, a first gate electrode GE1, a first source electrode SE1, and a first drain electrode DE1.

The first active layer ACT1 is disposed on the upper buffer layer 111. The first active layer ACT1 may be made of a semiconductor material such as an oxide semiconductor, amorphous silicon, or polycrystalline silicon, but is not limited thereto. For example, if the first active layer ACT1 is made of an oxide semiconductor, the first active layer ACT1 may be composed of a channel region, a source region, and a drain region. The source region and the drain region may be conductive regions. However, the present disclosure is not limited thereto.

The gate insulating layer 112 is disposed on the first active layer ACT1. The gate insulating layer 112 serves to insulate the first gate electrode GE1 from the first active layer ACT1, and may be made of an insulating material. For example, the gate insulating layer 112 may be formed as a single layer or a multilayer of silicon oxide (SiOx) or silicon nitride (SiNx), but is not limited thereto.

The first gate electrode GE1 is disposed on the gate insulating layer 112 so as to overlap the first active layer ACT1. The first gate electrode GE1 may be made of a conductive material such as copper (Cu), aluminum (Al), molybdenum (Mo), nickel (Ni), titanium (Ti), chromium (Cr), or an alloy thereof, but is not limited thereto.

The first source electrode SE1 and the first drain electrode DE1 are disposed to be spaced apart from each other on the gate insulating layer 112. The first source electrode SE1 and the first drain electrode DE1 may be electrically connected to the first active layer ACT1 through contact holes formed in the gate insulating layer 112. The first source electrode SE1 and the first drain electrode DE1 may be made of the same conductive material and disposed on the same layer as the first gate electrode GE1. However, the present disclosure is not limited thereto. For example, the first source electrode SE1 and the first drain electrode DE1 may be made of copper (Cu), aluminum (Al), molybdenum (Mo), nickel (Ni), titanium (Ti), chromium (Cr), or an alloy thereof. However, the present disclosure is not limited thereto.

The first drain electrode DE1 is electrically connected to the high potential power line VDD. For example, the first drain electrodes DE1 of the red sub-pixel SPR and the white sub-pixel SPW may be electrically connected to the high potential power line VDD on the left of the red sub-pixel SPR. Also, the first drain electrodes DE1 of the blue sub-pixel SPB and the green sub-pixel SPG may be electrically connected to the high potential power line VDD on the right of the green sub-pixel SPG.

An auxiliary high potential power line VDDa may be further disposed to electrically connect the first drain electrode DE1 to the high potential power line VDD. One end of the auxiliary high potential power line VDDa may be electrically connected to the high potential power line VDD and the other end may be electrically connected to the first drain electrode DE1 in each of the plurality of sub-pixels SP. For example, the auxiliary high potential power line VDDa may be made of the same material on the same layer as the first drain electrode DEL In this case, one end of the auxiliary high potential power line VDDa may be electrically connected to the high potential power line VDD through a contact hole formed in the gate insulating layer 112 and the upper buffer layer 111. Also, the other end of the auxiliary high potential power line VDDa may extend toward the first drain electrode DE1 and may be formed as one body with the first drain electrode DEL The first drain electrode DE1 of the red sub-pixel SPR and the first drain electrode DE1 of the white sub-pixel SPW electrically connected to the same high potential power line VDD may be connected to the same auxiliary high potential power line VDDa. Likewise, the first drain electrode DE1 of the blue sub-pixel SPB and the first drain electrode DE1 of the green sub-pixel SPG may be connected to the same auxiliary high potential power line VDDa. The first drain electrode DE1 may also be electrically connected to the high potential power line VDD in other ways and is not limited thereto.

The first source electrode SE1 may be electrically connected to the light shielding layer LS through a contact hole formed in the gate insulating layer 112 and the upper buffer layer 111. Also, a part of the first active layer ACT1 connected to the first source electrode SE1 may be electrically connected to the light shielding layer LS through a contact hole formed in the upper buffer layer 111. When the light shielding layer LS floats, a threshold voltage of the first transistor TR1 is changed, which may affect driving of the display device 100. Thus, the light shielding layer LS may be electrically connected to the first source electrode SE1 to apply a voltage to the light shielding layer LS and not to affect driving of the first transistor TR1. It has been described in the present disclosure that both the first active layer ACT1 and the first source electrode SE1 are in contact with the light shielding layer LS. However, any one of the first source electrode SE1 and the first active layer ACT1 may be in direct contact with the light shielding layer LS, and the present disclosure is not limited thereto.

Meanwhile, FIG. 5 illustrates that the gate insulating layer 112 is formed on the entire surface of the first substrate 101. However, the gate insulating layer 112 may be patterned to overlap only the first gate electrode GE1, the first source electrode SE1, and the first drain electrode DE1 and is not limited thereto.

The second transistor TR2 includes the second active layer ACT2, a second gate electrode GE2, a second source electrode SE2, and a second drain electrode DE2.

The second active layer ACT2 is disposed on the upper buffer layer 111. The second active layer ACT2 may be made of a semiconductor material such as an oxide semiconductor, amorphous silicon, or polycrystalline silicon, but is not limited thereto. For example, if the second active layer ACT2 is made of an oxide semiconductor, the second active layer ACT2 is composed of a channel region, a source region, and a drain region. The source region and the drain region may be conductive regions. However, the present disclosure is not limited thereto.

The second source electrode SE2 is disposed on the upper buffer layer 111. The second source electrode SE2 may be formed as one body with the second active layer ACT2 and thus may be electrically connected to each other. For example, the second source electrode SE2 may be formed by forming a semiconductor material on the upper buffer layer 111 and making a part of the semiconductor material conductive. Thus, a non-conductive part of the semiconductor material may become the second active layer ACT2, and a conductive part may become the second source electrode SE2. However, the second active layer ACT2 and the second source electrode SE2 may be formed separately, and the present disclosure is not limited thereto.

The second source electrode SE2 may be electrically connected to the first gate electrode GE1 of the first transistor TR1. The first gate electrode GE1 may be electrically connected to the second source electrode SE2 through a contact hole formed in the gate insulating layer 112. Therefore, the first transistor TR1 may be turned on or off in response to a signal from the second transistor TR2.

The gate insulating layer 112 is disposed on the second active layer ACT2 and the second source electrode SE2. The second drain electrode DE2 and the second gate electrode GE2 are disposed on the gate insulating layer 112.

The second gate electrode GE2 is disposed on the gate insulating layer 112 so as to overlap the second active layer ACT2. The second gate electrode GE2 may be electrically connected to the gate line GL, and the second transistor TR2 may be turned on or off based on a gate voltage transmitted to the second gate electrode GE2. The second gate electrode GE2 may be made of a conductive material such as copper (Cu), aluminum (Al), molybdenum (Mo), nickel (Ni), titanium (Ti), chromium (Cr), or an alloy thereof, but is not limited thereto.

Meanwhile, the second gate electrode GE2 may extend from the gate line GL. That is, the second gate electrode GE2 may be formed as one body with the gate line GL, and the second gate electrode GE2 and the gate line GL may be made of the same conductive material. For example, the gate line GL may be made of copper (Cu), aluminum (Al), molybdenum (Mo), nickel (Ni), titanium (Ti), chromium (Cr), or an alloy thereof, but is not limited thereto.

The gate line GL serves to transmit a gate voltage to each of the plurality of sub-pixels SP and may extend in the row direction crossing the circuit area of the plurality of sub-pixels SP. Since the gate line GL extends in the row direction, it may intersect the plurality of high potential power lines VDD, the plurality of data lines DL, and the plurality of reference lines RL extending in the column direction.

The second drain electrode DE2 is disposed on the gate insulating layer 112. The second drain electrode DE2 may be electrically connected to the second active layer ACT2 through a contact hole formed in the gate insulating layer 112. Also, the second drain electrode DE2 may be electrically connected to one of the plurality of data lines DL through a contact hole formed in the gate insulating layer 112 and the upper buffer layer 111. For example, the second drain electrode DE2 of the red sub-pixel SPR may be electrically connected to the first data line DL1, and the second drain electrode DE2 of the white sub-pixel SPW may be electrically connected to the second data line DL2. For example, the second drain electrode DE2 of the blue sub-pixel SPB may be electrically connected to the third data line DL3, and the second drain electrode DE2 of the green sub-pixel SPG may be electrically connected to the fourth data line DL4. The second drain electrode DE2 may be made of a conductive material such as copper (Cu), aluminum (Al), molybdenum (Mo), nickel (Ni), titanium (Ti), and chromium (Cr), or an alloy thereof, but is not limited thereto.

The third transistor TR3 includes the third active layer ACT3, a third gate electrode GE3, a third source electrode SE3, and a third drain electrode DE3.

The third active layer ACT3 is disposed on the upper buffer layer 111. The third active layer ACT3 may be made of a semiconductor material such as an oxide semiconductor, amorphous silicon, or polycrystalline silicon, but is not limited thereto. For example, if the third active layer ACT3 is made of an oxide semiconductor, the third active layer ACT3 is composed of a channel region, a source region, and a drain region. The source region and the drain region may be conductive regions. However, the present disclosure is not limited thereto.

The gate insulating layer 112 is disposed on the third active layer ACT3. The third gate electrode GE3, the third source electrode SE3, and the third drain electrode DE3 are disposed on the gate insulating layer 112.

The third gate electrode GE3 is disposed on the gate insulating layer 112 so as to overlap the third active layer ACT3. The third gate electrode GE3 may be electrically connected to the sensing line SL, and the third transistor TR3 may be turned on or off based on a sensing voltage transmitted to the third transistor TR3. The third gate electrode GE3 may be made of a conductive material such as copper (Cu), aluminum (Al), molybdenum (Mo), nickel (Ni), titanium (Ti), chromium (Cr), or an alloy thereof, but is not limited thereto.

Meanwhile, the third gate electrode GE3 may extend from the sensing line SL. That is, the third gate electrode GE3 may be formed as one body with the sensing line SL, and the third gate electrode GE3 and the sensing line SL may be made of the same conductive material. For example, the sensing line SL may be made of copper (Cu), aluminum (Al), molybdenum (Mo), nickel (Ni), titanium (Ti), chromium (Cr), or an alloy thereof, but is not limited thereto.

The sensing line SL serves to transmit a sensing voltage to each of the plurality of sub-pixels SP and extends in the row direction between the plurality of sub-pixels SP. For example, the sensing line SL may extend in the row direction at the boundary between the plurality of sub-pixels SP. Thus, the sensing line SL may intersect the plurality of high potential power lines VDD, the plurality of data lines DL, and the plurality of reference lines RL extending in the column direction.

The third source electrode SE3 may be electrically connected to the third active layer ACT3 through a contact hole formed in the gate insulating layer 112. The third source electrode SE3 may be made of a conductive material such as copper (Cu), aluminum (Al), molybdenum (Mo), nickel (Ni), titanium (Ti), and chromium (Cr), or an alloy thereof, but is not limited thereto.

Meanwhile, a part of the third active layer ACT3 in contact with the third source electrode SE3 may be electrically connected to the light shielding layer LS through a contact hole formed in the upper buffer layer 111. That is, the third source electrode SE3 may be electrically connected to the light shielding layer LS with the third active layer ACT3 interposed therebetween. Therefore, the third source electrode SE3 and the first source electrode SE1 may be electrically connected to each other through the light shielding layer LS.

The third drain electrode DE3 may be electrically connected to the third active layer ACT3 through a contact hole formed in the gate insulating layer 112. The third drain electrode DE3 may be made of a conductive material such as copper (Cu), aluminum (Al), molybdenum (Mo), nickel (Ni), titanium (Ti), chromium (Cr), or an alloy thereof, but is not limited thereto.

The third drain electrode DE3 may be electrically connected to the reference line RL. For example, the third drain electrodes DE3 of the red sub-pixel SPR, the white sub-pixel SPW, the blue sub-pixel SPB, and the green sub-pixel SPG forming a pixel may be electrically connected to the same reference line RL. That is, the plurality of sub-pixels SP forming a pixel may share one reference line RL.

In this case, an auxiliary reference line RLa may be disposed to transfer the reference line RL extending in the column direction to the plurality of sub-pixels SP disposed parallel to each other in the row direction. The auxiliary reference line RLa may extend in the row direction to electrically connect the reference line RL to the third drain electrode DE3 in each of the plurality of sub-pixels SP. One end of the auxiliary reference line RLa may be electrically connected to the reference line RL through a contact hole formed in the upper buffer layer 111 and the gate insulating layer 112. Further, the other end of the auxiliary reference line RLa may be electrically connected to the third drain electrode DE3 in each of the plurality of sub-pixels SP. In this case, the auxiliary reference line RLa may be formed as one body with the third drain electrode DE3 in each of the plurality of sub-pixels SP. Also, a reference voltage from the reference line RL may be transmitted to the third drain electrode DE3 through the auxiliary reference line RLa. However, the auxiliary reference line RLa may be formed separately from the third drain electrode DE3, and the present disclosure is not limited thereto.

The storage capacitor SC is disposed in the circuit area of the plurality of sub-pixels SP. The storage capacitor SC may store a voltage between the first gate electrode GE1 and the first source electrode SE1 of the first transistor TR1 to allow the light emitting element OLED to be maintained in a constant state for one frame. The storage capacitor SC includes a first capacitor electrode SC1 and a second capacitor electrode SC2.

The first capacitor electrode SC1 is disposed between the lower buffer layer 116 and the upper buffer layer 111 in each of the plurality of sub-pixels SP. The first capacitor electrode SC1 may be disposed most adjacent to the first substrate 101 among the conductive components disposed on the first substrate 101. The first capacitor electrode SC1 may be formed as one body with the light shielding layer LS and may be electrically connected to the first source electrode SE1 through the light shielding layer LS.

The upper buffer layer 111 is disposed on the first capacitor electrode SC1, and the second capacitor electrode SC2 is disposed on the upper buffer layer 111. The second capacitor electrode SC2 may be disposed to overlap the first capacitor electrode SC1. The second capacitor electrode SC2 may be formed as one body with the second source electrode SE2 and may be electrically connected to the second source electrode SE2 and the first gate electrode GE1. For example, the second source electrode SE2 and the second capacitor electrode SC2 may be formed by forming a semiconductor material on the upper buffer layer 111 and making a part of the semiconductor material conductive. Thus, a non-conductive part of the semiconductor material may serve as the second active layer ACT2 and a conductive part may serve as the second source electrode SE2 and the second capacitor electrode SC2. As described above, the first gate electrode GE1 is electrically connected to the second source electrode SE2 through the contact hole formed in the gate insulating layer 112. Therefore, the second capacitor electrode SC2 may be formed as one body with the second source electrode SE2 and may be electrically connected to the second source electrode SE2 and the first gate electrode GE1.

In summary, the first capacitor electrode SC1 of the storage capacitor SC may be formed as one body with the light shielding layer LS. Thus, the first capacitor electrode SC1 may be electrically connected to the light shielding layer LS, the first source electrode SE1, and the third source electrode SE3. Also, the second capacitor electrode SC2 may be formed as one body with the second source electrode SE2 and the second active layer ACT2. Thus, the second capacitor electrode SC2 may be electrically connected to the second source electrode SE2 and the first gate electrode GE1. The first capacitor electrode SC1 and the second capacitor electrode SC2 overlap each other with the upper buffer layer 111 interposed therebetween. The first capacitor electrode SC1 and the second capacitor electrode SC2 may maintain a constant voltage of the first gate electrode GE1 and the first source electrode SE1 in the first transistor TR1 while the light emitting element OLED emits light. Thus, the light emitting element OLED may be maintained in a constant state.

The first passivation layer 113 is disposed on the first transistor TR1, the second transistor TR2, the third transistor TR3, and the storage capacitor SC. The first passivation layer 113 is an insulating layer for protecting components under the first passivation layer 113. For example, the first passivation layer 113 may be formed as a single layer or a multilayer of silicon oxide (SiOx) or silicon nitride (SiNx), but is not limited thereto. The first passivation layer 113 may be omitted in some example embodiments.

The plurality of color filters CF is disposed on the first passivation layer 113 in the emission areas of the plurality of sub-pixels SP, respectively. As described above, the display device 100 according to an example embodiment of the present disclosure is of a bottom emission type. Thus, light emitted from the light emitting element OLED may be directed toward a lower part of the light emitting element OLED and the first substrate 101. Therefore, the plurality of color filters CF may be disposed under the light emitting element OLED. The light emitted from the light emitting element OLED may pass through the plurality of color filters CF to be converted into light of various colors.

The plurality of color filters CF includes the red color filter CFR, the blue color filter CFB, and the green color filter CFG. The red color filter CFR may be disposed in the emission area of the red sub-pixel SPR among the plurality of sub-pixels SP. The blue color filter CFB may be disposed in the emission area of the blue sub-pixel SPB. Also, the green color filter CFG may be disposed in the emission area of the green sub-pixel SPG.

A second passivation layer 119 is disposed on the first passivation layer 113 and the plurality of color filters CF. The second passivation layer 119 is an insulating layer to protect the components disposed under the second passivation layer 119. For example, the second passivation layer 119 may be formed as a single layer or a multilayer of silicon oxide (SiOx) or silicon nitride (SiNx), but is not limited thereto. The second passivation layer 119 may be omitted in some example embodiments.

The planarization layer 114 is disposed on the second passivation layer 119.

The planarization layer 114 is an insulating layer to planarize an upper part of the first substrate 101. On the first substrate 101, the first transistor TR1, the second transistor TR2, the third transistor TR3, the storage capacitor SC, the plurality of high potential power lines VDD, the plurality of data lines DL, the plurality of reference lines RL, the plurality of gate lines GL and the plurality of sensing line SL are disposed. The planarization layer 114 may be made of an organic material. For example, the planarization layer 114 may be formed as a single layer or a multilayer of polyimide or photo acryl, but is not limited thereto.

The light emitting element OLED is disposed in the emission area in each of the plurality of sub-pixels SP. The light emitting element OLED is disposed on the planarization layer 114 in each of the plurality of sub-pixels SP. The light emitting element OLED includes the anode AN, an emission layer EL, and a cathode CA.

The anode AN is disposed on the planarization layer 114 in the emission area. The anode AN supplies holes to the emission layer EL and thus may be made of a conductive material having a high work function. The anode AN may be made of a transparent conductive material such as indium tin oxide (ITO) and indium zinc oxide (IZO), but is not limited thereto.

Meanwhile, the anode AN may extend toward the circuit area. A part of the anode AN may extend from the emission area toward the first source electrode SE1 of the circuit area, and may be electrically connected to the first source electrode SE1 through a contact hole formed in the planarization layer 114 and the first passivation layer 113. Therefore, the anode AN of the light emitting element OLED may extend to the circuit area. Also, the anode AN may be electrically connected to the first source electrode SE1 of the first transistor TR1 and the second capacitor electrode SC2 of the storage capacitor SC.

The emission layer EL is disposed on the anode AN in the emission area and the circuit area. The emission layer EL may be formed as a single layer over the plurality of sub-pixels SP. That is, the emission layers EL of the plurality of sub-pixels SP may be connected to each other and may be formed as one body with each other. The emission layer EL may be configured as a single emission layer or may have a structure in which a plurality of emission layers each emitting light of a different color are laminated. The emission layer EL may further include an organic layer such as a hole injection layer, a hole transport layer, an electron transport layer, or an electron injection layer.

The cathode CA is disposed on the emission layer EL in the emission area and the circuit area. The cathode CA supplies electrons to the emission layer EL and thus may be made of a conductive material having a low work function. The cathode CA may be formed as a single layer over the plurality of sub-pixels SP. That is, the cathodes CA of the plurality of sub-pixels SP may be connected to each other and may be formed as one body with each other. The cathode CA may be made of a transparent conductive material such as indium tin oxide (ITO) or indium zinc oxide (IZO), or an ytterbium (Yb) alloy. The cathode CA may further include a metal doping layer, but is not limited thereto. Meanwhile, although not shown in FIG. 4 and FIG. 5, the cathode CA of the light emitting element OLED may be electrically connected to the low potential power line VSS to be supplied with a low potential power voltage.

The bank 115 is disposed between the anode AN and the emission layer EL. The bank 115 is disposed to overlap the active area AA and cover an edge of the anode AN. The bank 115 is disposed at the boundary between adjacent sub-pixels SP to suppress color mixture of light emitted from the light emitting elements OLED of the plurality of sub-pixels SP. The bank 115 may be made of an insulating material. The bank 115 may be made of, for example, polyimide, acryl, or a benzocyclobutene (BCB) based resin, but it is not limited thereto.

Hereinafter, a pad area where the flexible films 160 are disposed will be described with reference to FIG. 6 through FIG. 8.

Referring to FIG. 6, a plurality of pad electrodes PE is disposed on the pad part P. The pad part P may be connected to the printed circuit board 170 through the flexible film 160. The plurality of pad electrodes PE may be made of the same material as various conductors disposed in the active area AA, but is not limited thereto.

The plurality of link lines 190 is disposed to connect the plurality of pad electrodes PE to the plurality of sub-pixels SP. The plurality of link lines 190 may be formed as one body with the plurality of pad electrodes PE or may be formed separately.

The plurality of link lines 190 may be connected to a plurality of signal lines, such as the gate line GL, the data line DL, the high potential power line VDD, the sensing line SL, and the reference line RL, connected to the plurality of sub-pixels SP. Thus, a signal applied from the flexible film 160 to the plurality of pad electrodes PE may be transmitted to the plurality of signal lines through the plurality of link lines 190.

The plurality of link lines 190 includes a plurality of first link lines 191 and a plurality of second link lines 192.

The plurality of first link lines 191 refers to the link lines 190 connected to the pad electrodes PE located at tip ends PT1, PT2 of the pad part P. It should be appreciated that although in some implementations, link lines 190 refer to the link lines that are connected to pad electrodes PE located at one of two opposite tip ends PT1, PT2, as illustratively shown in FIG. 10, the scope of the disclosure is not limited by such implementations. In some implementations, link lines 190 may be connected to pad electrodes PE located at more than two opposite tip ends of pad P.

Each of the plurality of first link lines 191 may be connected to one of the plurality of signal lines to which a constant voltage is applied, or one of dummy lines. For example, the plurality of first link lines 191 may be connected to lines, such as low potential power lines VSS or high potential power lines, to which a constant voltage is applied, or may be connected to dummy lines.

The plurality of second link lines 192 refers to the link lines 190 connected to other pad electrodes PE except the pad electrodes PE located at the two tip ends of the pad part P. Thus, the plurality of second link lines 192 may be disposed between the plurality of first link lines 191.

The plurality of second link lines 192 may be connected to signal lines to which a time-varying voltage is applied. That is, the plurality of second link lines 192 may be connected to lines to which other signals, instead of a constant voltage, is applied.

The plurality of first link lines 191 may have a greater width than the plurality of second link lines 192. As described above, the plurality of first link lines 191 is applied with a constant voltage, and thus, it is beneficial to have a low resistance value. Therefore, the plurality of first link lines 191 applied with a constant voltage may be set to have a greater width than the plurality of second link lines 192. Also, the plurality of second link lines 192 to which the constant voltage is not applied may be set to have a smaller width than the plurality of first link lines 191.

Referring to FIG. 6 and FIG. 7, the plurality of link lines 190 is not disposed in the non-active area NA. In FIG. 6, area X is an area of the polarization plate 150 and/or of the non-active area NA which is exposed by the first substrate 101 and/or exposed by the pad part P and the plurality of link lines 190. The plurality of link lines 190 (191, 192) is not disposed in the area X. Also, the first substrate 101 and the plurality of inorganic insulating layers may not be disposed in the non-active area NA. For example, the first substrate 101 and the plurality of inorganic insulating layers may not be disposed in an area corresponding to a tip end 140E of the second substrate 140. The first substrate 101/or the plurality of inorganic insulating layers may not be disposed in the non-active area NA except an area where the plurality of link lines 190 and the pad part P are disposed on one side of the display device 100 where the pad part P is disposed. Therefore, the first substrate 101 and the plurality of inorganic insulating layers may not be disposed in the area X of FIG. 6.

As shown in FIG. 7, the planarization layer 114 may be disposed to cover tip end 101E of the first substrate 101 and adjacent tip ends of the plurality of inorganic insulating layers, and the bank 115 may be disposed on the planarization layer 114. Also, the planarization layer 114 may be attached to the polarization plate 150. FIG. 7 illustrates that the polarization plate 150 is in direct contact with the planarization layer 114. However, the present disclosure is not limited thereto. An adhesive layer used for attaching the polarization plate 150 may be in contact with the planarization layer 114.

Referring to FIG. 6, the plurality of inorganic insulating layers may be disposed except an area between a plurality of pad parts P. That is, the plurality of inorganic insulating layers may be disposed except the area X of FIG. 6. Thus, the plurality of inorganic insulating layers may be disposed in all of areas where the plurality of second link lines 192 connected to the plurality of pad parts P is disposed.

The plurality of inorganic insulating layers may not be disposed in all of areas where the plurality of first link lines 191 connected to the plurality of pad parts P is disposed. In FIG. 6, area Y is an area of the area where the first link lines 191 and an end of the second substrate 140 overlap. And the first substrate 101 and the plurality of inorganic insulating layers may not be disposed in the area Y. Referring to FIG. 6 and FIG. 8, each of the plurality of first link lines 191 includes a first line pattern 191-1, a second line pattern 191-2, and a third line pattern 191-3.

The first line pattern 191-1 may be connected to the plurality of signal lines disposed on the first substrate 101. That is, the first line pattern 191-1 is disposed closer to the active area AA than the second line pattern 191-2 and the third line pattern 191-3, and may be directly connected to a signal line.

The first line pattern 191-1 may include a plurality of conductive layers. When the first line pattern 191-1 includes a plurality of conductive layers and the plurality of conductive layers is in contact with each other, a line resistance of the first line pattern 191-1 may decrease. Also, even if a crack occurs in one of the conductive layers, a signal may be transmitted through the other conductive layers. For example, as shown in FIG. 8, the first line pattern 191-1 may include a first conductive layer 191-1a and a second conductive layer 191-1b disposed on the first conductive layer 191-1a so as to be in contact with the first conductive layer 191-1a. The first conductive layer 191-1a may be made of the same material on the same layer as the light shielding layer LS. Also, the second conductive layer 191-1b may be made of the same material on the same layer as the gate line GL and the sensing line SL. However, the present disclosure is not limited thereto. The first line pattern 191-1 may be formed as a single layer depending on design choice.

The second line pattern 191-2 may be connected to the pad part P. Thus, the second line pattern 191-2 may be disposed closer to an outer periphery of the first substrate 101 than the first line pattern 191-1 and the third line pattern 191-3. The second line pattern 191-2 may be disposed on the same layer as the first line pattern 191-1.

The second line pattern 191-2 may include a plurality of conductive layers. When the second line pattern 191-2 includes a plurality of conductive layers and the plurality of conductive layers is in contact with each other, a line resistance of the second line pattern 191-2 may decrease. Also, even if a crack occurs in one of the conductive layers, a signal may be transmitted through the other conductive layers. For example, as shown in FIG. 8, the second line pattern 191-2 may include a first conductive layer 191-2a and a second conductive layer 191-2b disposed on the first conductive layer 191-2a so as to be in contact with the first conductive layer 191-2a. The first conductive layer 191-2a may be made of the same material on the same layer as the light shielding layer LS. Also, the second conductive layer 191-2b may be made of the same material on the same layer as the gate line GL and the sensing line SL. However, the present disclosure is not limited thereto. The second line pattern 191-2 may be formed as a single layer depending on design choice.

The first line pattern 191-1 and the second line pattern 191-2 of the first link line 191 may be disposed on the same layer as at least one of the plurality of signal lines. That is, the first conductive layers 191-1a and 191-2a and the second conductive layers 191-1b and 191-2b may be disposed on the same layer as at least one of the plurality of signal lines.

For example, the first conductive layers 191-1a and 191-2a may be disposed on the same layer as a light shielding layer disposed on the lower buffer layer 116. Thus, the first conductive layers 191-1a and 191-2a may be disposed on the same layer as a data line, a high potential power line, a reference line, etc., disposed on the same layer as the light shielding layer.

Also, the second conductive layers 191-1b and 191-2b may be disposed on the same layer as the gate line GL, the sensing line, etc.

The third line pattern 191-3 may be disposed on the first line pattern 191-1 and the second line pattern 191-2 of the first link line 191. The third line pattern 191-3 may be disposed between the first line pattern 191-1 and the second line pattern 191-2 of the first link line 191 to connect the first line pattern 191-1 and the second line pattern 191-2. For example, a contact hole 113H may be formed in the first passivation layer 113 covering the first line pattern 191-1 and the second line pattern 191-2. The first line pattern 191-1, the second line pattern 191-2, and the third line pattern 191-3 may be electrically connected to each other through the contact hole.

The third line pattern 191-3 may overlap a tip end of the second substrate 140. That is, as shown in FIG. 6 and FIG. 8, only the third line pattern 191-3 among the first line pattern 191-1, the second line pattern 191-2, and the third line pattern 191-3 is disposed to overlap the tip end of the second substrate 140. The first line pattern 191-1 and the second line pattern 191-2 may not overlap the tip end of the second substrate 140.

Meanwhile, referring to FIG. 6 and FIG. 8, the lower buffer layer 116, the upper buffer layer 111, the gate insulating layer 112, and the first passivation layer 113 may be disposed except an area where the third line pattern 191-3 of the first link line 191 overlaps the tip end of the second substrate 140. For example, as shown in FIG. 8, the lower buffer layer 116, the upper buffer layer 111, and the gate insulating layer 112 may not be disposed in an area Y where the tip end 140E of the second substrate 140 is disposed. For example, the lower buffer layer 116, the upper buffer layer 111, and the gate insulating layer 112 may each includes a hole (collectively referred to as hole Hy) that exposes the first substrate 101. The hole Hy overlaps the area Y. The lower buffer layer 116, the upper buffer layer 111, and the gate insulating layer 112 each does not overlap with the tip end 140E of the second substrate 140. Also, the first passivation layer 113 may be disposed on the first line pattern 191-1 and the second line pattern 191-2 to cover side surfaces of the lower buffer layer 116, the upper buffer layer 111, the gate insulating layer 112, the first line pattern 191-1, and the second line pattern 191-2. The first passivation layer 113 contacts the first substrate 101, and does not overlap with the tip end 140E of the second substrate 140. Thus, the first passivation layer 113 may not be disposed in the area Y. Therefore, the first substrate 101 may be exposed in the area Y by the lower buffer layer 116, the upper buffer layer 111, the gate insulating layer 112, and the first passivation layer 113.

The filling layer 180 may be disposed between the third line pattern 191-3 and the first substrate 101 of the first link line 191.

The filling layer 180 may be disposed at an area where the plurality of inorganic insulating layers is removed in an area overlapping the tip end of the second substrate 140. Thus, the first passivation layer 113 may be in contact with a side surface 180S of the filling layer 180. Also, the filling layer 180 may be disposed on an area of the first substrate 101 where one surface is exposed between the first line pattern 191-1 and the second line pattern 191-2. Thus, the filling layer 180 may be disposed to overlap the third line pattern 191-3 of the first link line 191. Therefore, the filling layer 180 may be disposed to be enclosed by the third line pattern 191-3 of the first link line 191, the first passivation layer 113, and the first substrate 101.

The filling layer 180 may be disposed under the third line pattern 191-3 of the first link line 191 and may have a flat upper surface 180U to dispose the third line pattern 191-3 on the flat surface.

The filling layer 180 may be made of an organic insulating material to suppress the occurrence of cracks in the third line pattern 191-3 disposed thereon.

The second passivation layer 119 is disposed on the first passivation layer 113 and the third line pattern 191-3. The second passivation layer 119 may protect various lines disposed thereunder, for example, the third line pattern 191-3 disposed right under the second passivation layer 119.

In the display device 100 according to an example embodiment of the present disclosure, the first substrate 101 is made of any one of transparent conductive oxides and oxide semiconductors. Thus, it is possible to reduce the thickness of the display device 100. Conventionally, a plastic substrate has been used for a substrate of a display device. However, the plastic substrate is formed by coating and curing a substrate material at a high temperature. Thus, it may take a long time to form the plastic substrate and it is difficult to form the plastic substrate to a predetermined thickness or less. However, the transparent conductive oxides and oxide semiconductors may be formed to a very small thickness through a deposition process such as sputtering. Therefore, in the display device 100 according to an example embodiment of the present disclosure, the first substrate 101 configured to support various components of the display device 100 is formed as one of a transparent conductive oxide layer or an oxide semiconductor layer. Thus, the thickness of the display device 100 may be reduced and the display device 100 may have a slim design.

Further, in the display device 100 according to an example embodiment of the present disclosure, the first substrate 101 is made of a transparent conductive oxide or an oxide semiconductor to enhance the flexibility of the display device 100. Also, it is possible to reduce a stress generated when the display device 100 is deformed. For example, if the first substrate 101 is formed as a transparent conductive oxide layer or an oxide semiconductor layer, the first substrate 101 may be formed as a very thin film. In this case, the first substrate 101 may also be referred to as a first transparent thin film layer. Accordingly, the display device 100 including the first substrate 101 may have high flexibility, and the display device 100 may be easily bent or rolled. Therefore, in the display device 100 according to an example embodiment of the present disclosure, the first substrate 101 is formed as any one of a transparent conductive oxide layer or an oxide semiconductor layer. Thus, the flexibility of the display device 100 may be enhanced and a stress generated when the display device 100 is deformed may be reduced. Therefore, it is possible to minimize the occurrence of cracks or the like in the display device 100.

Furthermore, in the display device 100 according to an example embodiment of the present disclosure and the method for manufacturing the same, the first substrate 101 is formed as any one of a transparent conductive oxide layer and an oxide semiconductor layer. Thus, it is possible to reduce the possibility of generating static electricity in the first substrate 101. If the first substrate 101 is made of plastic and static electricity is generated, static electricity may damage various lines and driving elements on the first substrate 101 or influence driving of the elements. Therefore, display quality may be degraded. However, if the first substrate 101 is formed as a transparent conductive oxide layer or an oxide semiconductor layer, it is possible to minimize the generation of static electricity in the first substrate 101. Also, it is possible to simplify a component for blocking and discharging static electricity. Therefore, in the display device 100 according to an example embodiment of the present disclosure, the first substrate 101 is formed as any one of a transparent conductive oxide layer or an oxide semiconductor layer. Thus, it is possible to minimize damage or degradation in display quality caused by static electricity.

Also, in the display device 100 according to an example embodiment of the present disclosure, the first substrate 101 is made of a transparent conductive oxide or an oxide semiconductor. Thus, it is possible to minimize the permeation of moisture or oxygen from the outside into the display device 100 through the first substrate 101. If the first substrate 101 is formed as a transparent conductive oxide layer or an oxide semiconductor layer, the first substrate 101 is formed in a vacuum environment. Therefore, the possibility of generating foreign matters is remarkably low. Further, even if foreign matters are generated, the foreign matters are very small in size. Therefore, it is possible to minimize the permeation of moisture and oxygen into the display device 100. Accordingly, in the display device 100 according to an example embodiment of the present disclosure, the first substrate 101 is made of a transparent conductive oxide or an oxide semiconductor which is less likely to generate foreign matters and has excellent moisture blocking performance. Thus, it is possible to improve the reliability of the light emitting element OLED including an organic layer and the display device 100.

Further, in the display device 100 according to an example embodiment of the present disclosure and the method for manufacturing the same, the first substrate 101 is made of any one of transparent conductive oxides or oxide semiconductors. Thus, a barrier film, which is thin and cheap, may be attached under the first substrate 101. If the first substrate 101 is made of a material, such as plastic, having low moisture blocking performance, a barrier film, which is thick and expensive, may be attached to enhance the moisture blocking performance. However, in the display device 100 according to an example embodiment of the present disclosure, the first substrate 101 is made of a transparent conductive oxide or an oxide semiconductor having excellent moisture blocking performance. Thus, a barrier film, which is thin and cheap, may be attached under the first substrate 101. Therefore, in the display device 100 according to an example embodiment of the present disclosure, the first substrate 101 is made of any one of transparent conductive oxides or oxide semiconductors having excellent moisture blocking performance. Accordingly, it is possible to reduce manufacturing costs of the display device 100.

In the display device 100 according to an example embodiment of the present disclosure, the first substrate 101 is made of any one of transparent conductive oxides or oxide semiconductors. Thus, it is possible to perform a laser lift off (LLO) process. When the display device 100 is manufactured, a temporary substrate SUB on which a sacrificial layer is formed may be attached under the first substrate 101 and then, the pixel unit 120 may be formed on the first substrate 101. For example, the sacrificial layer may be made of hydrogenated amorphous silicon or hydrogenated and impurity-doped amorphous silicon. If a laser is irradiated from below the temporary substrate SUB after the display device 100 is completely manufactured, the sacrificial layer may be dehydrogenated. Also, the sacrificial layer and the temporary substrate SUB may be separated from the first substrate 101. In this case, the transparent conductive oxide and the oxide semiconductor are materials suitable for the LLO process of the sacrificial layer and the temporary substrate SUB. Thus, even if the first substrate 101 is made of any one of the transparent conductive oxide or the oxide semiconductor, the first substrate 101 may be easily separated from the temporary substrate SUB. Therefore, in the display device 100 according to an example embodiment of the present disclosure, the first substrate 101 is formed as one of a transparent conductive oxide layer or an oxide semiconductor layer suitable for the LLO process. Accordingly, the display device 100 may be easily manufactured by using the existing process and equipment.

Meanwhile, if a lower substrate is made of any one of transparent conductive oxides and oxide semiconductors, the thickness of the lower substrate may be reduced compared to a case where a plastic substrate is used for the lower substrate. Thus, while a polarization plate is bonded after a temporary substrate is removed in the above-described LLO process, cracks may occur in an outer peripheral portion of the display device. Also, a first substrate and an inorganic layer may be easily cracked and damaged by external impacts. Further, if cracks occur in the first substrate and the inorganic layer, they may propagate to other components. For example, if the cracks propagate to lines or circuit components, a driving error may occur. For example, one side of the display device on which a flexible film is disposed may be more easily cracked than the other side.

If the display device is implemented as a rollable display device, the display may be repeatedly wound on or unwound from a roller. In this case, a stress is concentrated on a position corresponding to a tip end of a second substrate having relatively high rigidity. In some implementations, a plurality of link lines connected to a pad part is disposed on one side of the display device on which a flexible film is disposed. If these link lines are cracked, a driving error of the display device may occur.

In the display device 100 according to an example embodiment of the present disclosure, the plurality of inorganic insulating layers may be minimally disposed on one side of the non-active area NA on which the plurality of pad parts P connected to the flexible film 160. For example, referring to FIG. 6 and FIG. 7, the plurality of inorganic insulating layers may not be disposed in the non-active area NA except for an area where the plurality of link lines 190 and the pad part P are disposed on one side of the display device 100 on which the pad part P is disposed. Thus, the plurality of inorganic insulating layers may not be disposed in an area overlapping the tip end of the second substrate 140 between the plurality of pad parts P. Therefore, the inorganic insulating layers are removed from a position where a stress is applied and cracks are highly likely to occur. Thus, it is possible to reduce the occurrence of cracks in the outer peripheral portion of the display device 100 and suppress a driving error of the display device 100. Accordingly, it is possible to improve the reliability of the display device 100.

Further, in the display device 100 according to an example embodiment of the present disclosure, the filling layer 180 instead of the inorganic insulating layers is disposed under the third line pattern 191-3 of the first link line 191. The third line pattern 191-3 of the first link line 191 overlaps the tip end of the second substrate 140. Thus, it is possible to suppress the occurrence of cracks in the third line pattern 191-3 of the first link line 191. In the display device 100, the inorganic insulating layers are not disposed under the third line pattern 191-3 of the first link line 191. Thus, it is possible to minimize the inorganic insulating layers, which is relatively vulnerable to a stress, overlaps the tip end of the second substrate 140. Further, the filling layer 180 made of an organic insulating material, which is elastic and may absorb a stress compared to inorganic insulating materials, is disposed under the third line pattern 191-3. Thus, the filling layer 180 may absorb a stress generated at the tip end of the second substrate 140. In some implementations, as described above, the width of the plurality of second link lines 192 may be minimized as the resolution and integration density of the display device increase. However, the width of the plurality of first link lines 191 to which a constant voltage is applied or connected to dummy line may be greater than that of the plurality of second link lines 192. As described above, a contact hole may be formed to connect the third line pattern 191-3 to the first line pattern 191-1 and the second line pattern 191-2 by patterning the inorganic insulating layers and patterning the first line pattern 191-1 and the second line pattern 191-2. In this case, it is necessary to secure a process margin. However, it is difficult to perform the above-described process to the plurality of second link lines 192 having a minimized width. Thus, the above-described process may be performed only to the plurality of first link lines 191 among the plurality of link lines 190 to implement the structure shown in FIG. 8. In the display device 100 according to an example embodiment of the present disclosure, the filling layer 180 absorbs a stress applied to the tip end of the second substrate 140. Also, the placement of the inorganic insulating layers, which may be cracked by a stress, is minimized. Thus, it is possible to minimize cracks of the inorganic insulating layers and the link line 190 which may occur at a position corresponding to the tip end of the second substrate 140.

Figure 9:
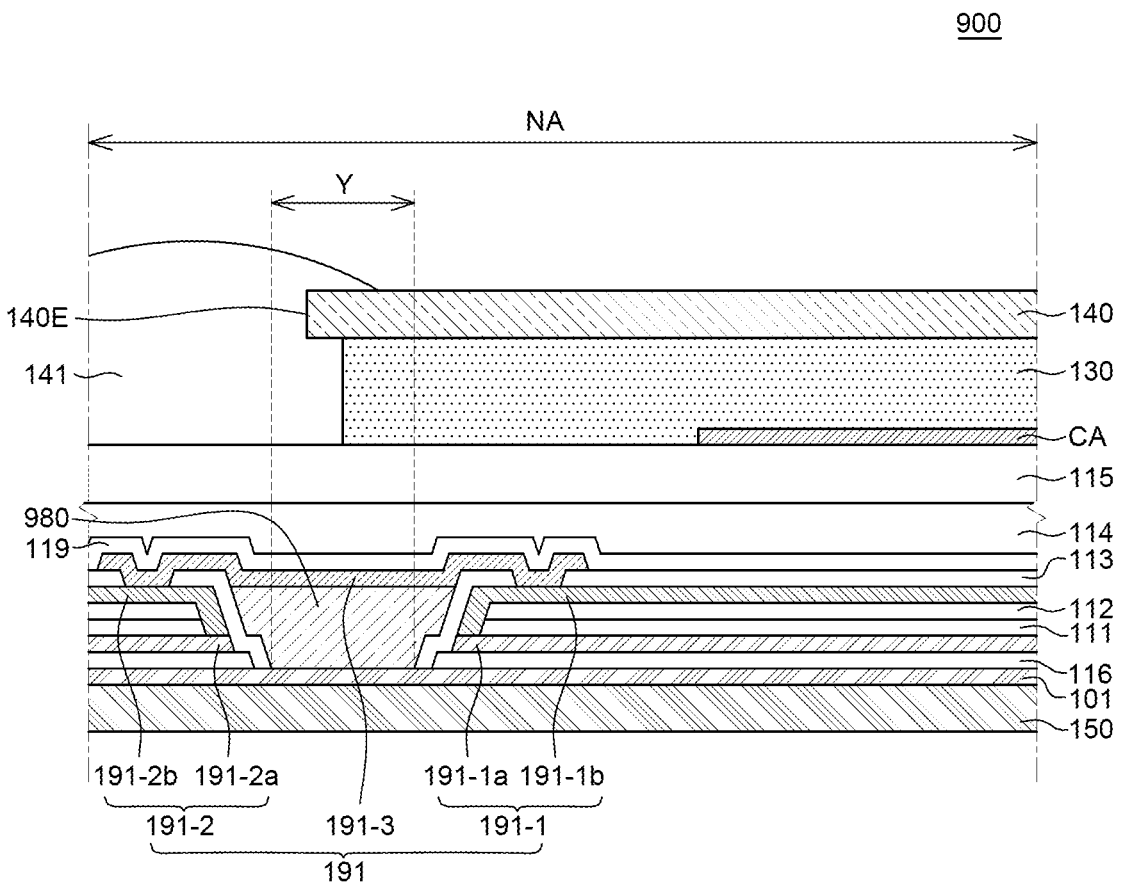
FIG. 9 is a cross-sectional view of a display device according to another example embodiment of the present disclosure.

FIG. 9 is a cross-sectional view of a display device according to another example embodiment of the present disclosure. A display device 900 shown in FIG. 9 is substantially the same as the display device 100 shown in FIG. 1 through FIG. 8 except a filling layer 980. Therefore, a repeated description thereof will be omitted.

Referring to FIG. 9, the filling layer 980 may be disposed between the third line pattern 191-3 of the first link line 191 and the first substrate 101.

The filling layer 980 may be disposed to overlap the third line pattern 191-3 of the first link line 191 at an area where the plurality of inorganic insulating layers is removed in an area overlapping the tip end of the second substrate 140.

The filling layer 980 may be made of an organic insulating material to suppress the occurrence of cracks in the third line pattern 191-3 disposed thereon and dispose the third line pattern 191-3 on a flat surface. In this case, the filling layer 980 may be made of the same material on the same layer as an organic material layer included in the display device 900. For example, the filling layer 980 may be made of the same material through the same process as the color filter CF. However, the present disclosure is not limited thereto. If there is any other organic material layer before the third line pattern 191-3 is formed, the third line pattern 191-3 may be made of the same material at the same time as the organic material layer.

In the display device 900 according to another example embodiment of the present disclosure, the placement of the plurality of inorganic insulating layers on one side of the non-active area NA on which the plurality of pad parts P connected to the flexible film 160 is disposed may be minimized. For example, the plurality of inorganic insulating layers may not be disposed in an area overlapping the tip end of the second substrate 140 between the plurality of pad parts P. Therefore, the inorganic insulating layers are removed from a position where a stress is applied and cracks are highly likely to occur. Thus, it is possible to reduce the occurrence of cracks in an outer peripheral portion of the display device 900 and suppress a driving error of the display device 900. Accordingly, it is possible to improve the reliability of the display device 900.

Further, in the display device 900 according to another example embodiment of the present disclosure, the filling layer 980 instead of the inorganic insulating layers is disposed under the third line pattern 191-3 of the first link line 191. The third line pattern 191-3 of the first link line 191 overlaps the tip end of the second substrate 140. Thus, it is possible to suppress the occurrence of cracks in the third line pattern 191-3 of the first link line 191.

Furthermore, in the display device 900 according to another example embodiment of the present disclosure, the filling layer 980 may be made of the same material through the same process as an organic material layer disposed in the display device 900. The organic material layer may be, for example, the color filter CF. Thus, an additional process for disposing the filling layer 980 may not be needed. Accordingly, it is possible to reduce manufacturing costs of the display device 900 and simplify a manufacturing process of the display device 900.

Figure 10:
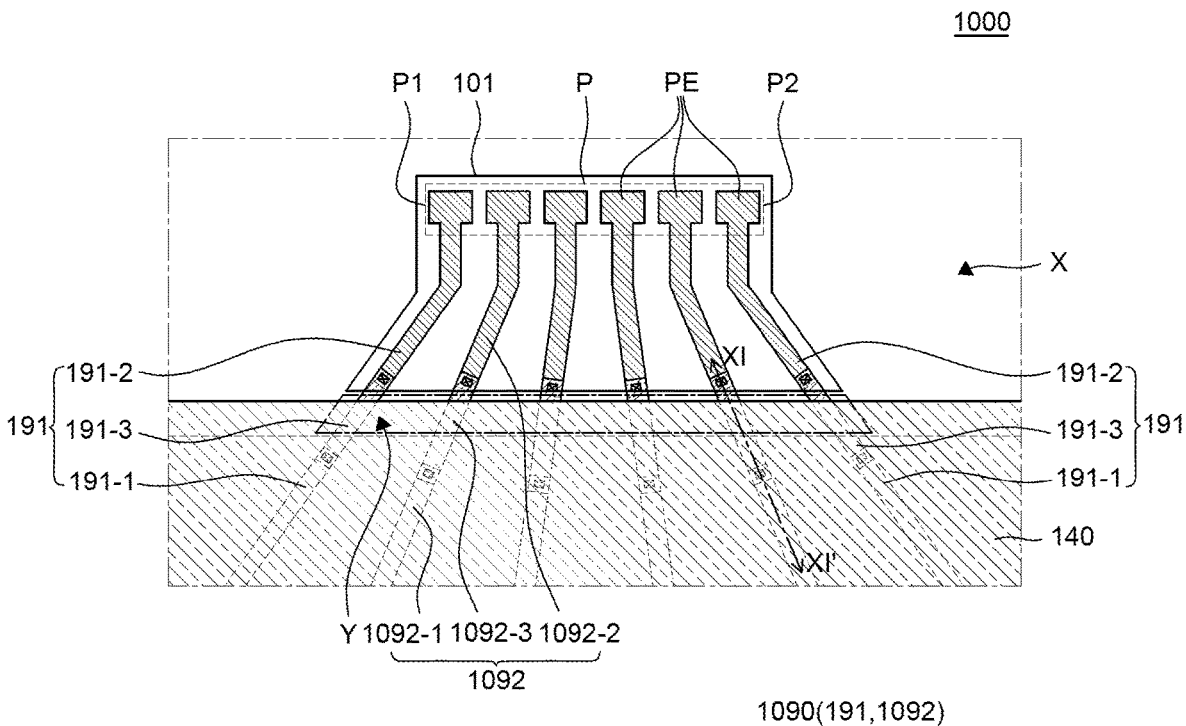
FIG. 10 is an enlarged plan view of a display device according to yet another example embodiment of the present disclosure.
Figure 11:
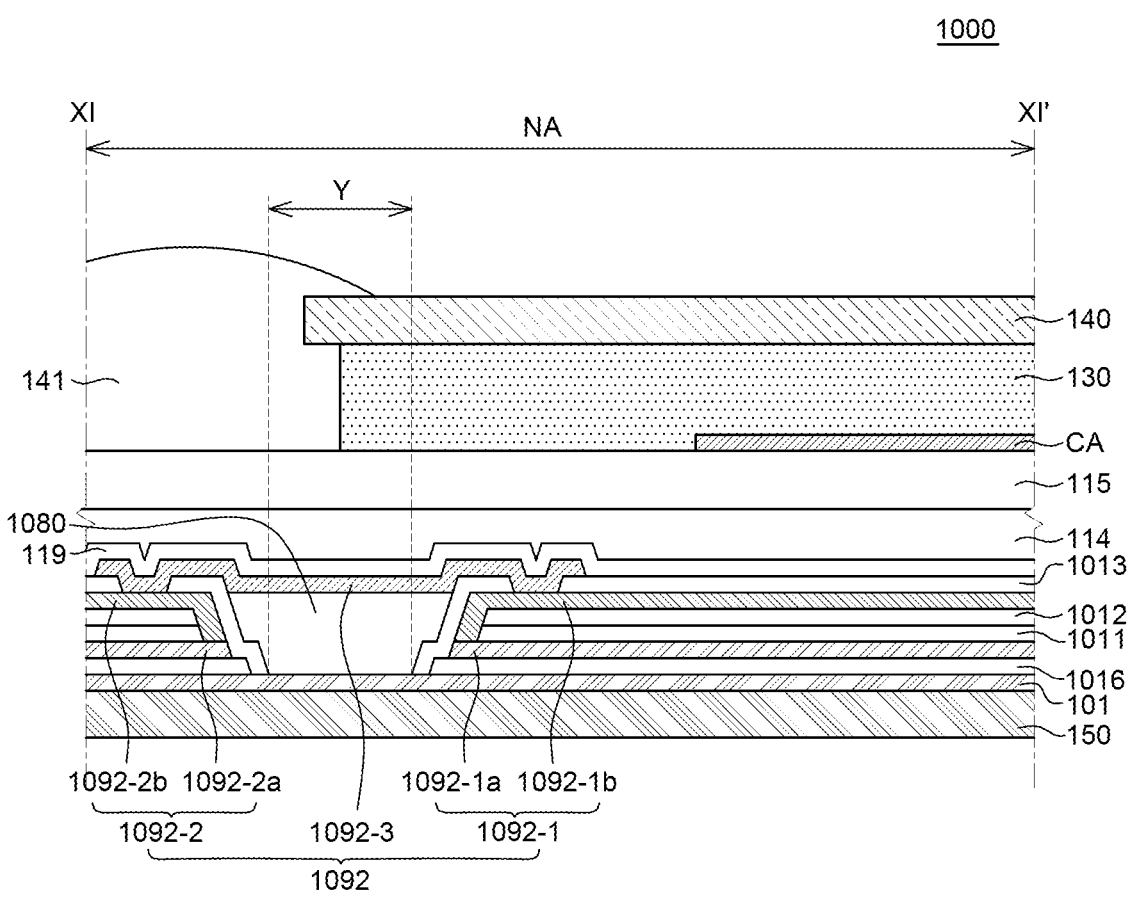
FIG. 11 is a cross-sectional view of the display device according to yet another example embodiment of the present disclosure.

FIG. 10 is an enlarged plan view of a display device according to yet another example embodiment of the present disclosure. FIG. 11 is a cross-sectional view of the display device according to yet another example embodiment of the present disclosure. A display device 1000 shown in FIG. 10 and FIG. 11 is substantially the same as the display device 100 shown in FIG. 1 through FIG. 8 except a lower buffer layer 1016, an upper buffer layer 1011, a gate insulating layer 1012, a first passivation layer 1013, a plurality of second link lines 1092, and a filling layer 1080. Therefore, a repeated description thereof will be omitted.

Referring to FIG. 10, a plurality of link lines 1090 includes the plurality of first link lines 191 and the plurality of second link lines 1092.

The plurality of first link lines 191 refers to the link lines 1090 connected to the pad electrodes PE located at two tip ends of the pad part P. The plurality of second link lines 1092 refers to the link lines 1090 connected to other pad electrodes PE except the pad electrodes PE located at the two tip ends of the pad part P.

The plurality of second link lines 1092 may have the same width as the plurality of first link lines 191. For example, if the second link line 1092 is connected to a signal line for which it is beneficial to have a low resistance value, the width of the second link line 1092 may increase. Thus, in the display device 1000 according to yet another example embodiment of the present disclosure, the plurality of second link lines 1092 may have the same width as the plurality of first link lines 191.

Referring to FIG. 11, each of the plurality of second link lines 1092 may include a first line pattern 1092-1, a second line pattern 1092-2, and a third line pattern 1092-3.

The first line pattern 1092-1 of the second link line 1092 may be connected to the plurality of signal lines disposed on the first substrate 101. That is, the first line pattern 1092-1 may be disposed closer to the active area AA than the second line pattern 1092-2 and the third line pattern 1092-3, and may be directly connected to a signal line.

The first line pattern 1092-1 of the second link line 1092 may include a plurality of conductive layers. For example, as shown in FIG. 11, the first line pattern 1092-1 may include a first conductive layer 1092-1*a* and a second conductive layer 1092-1*b* disposed on the first conductive layer 1092-1*a* so as to be in contact with the first conductive layer 1092-1*a*. The first conductive layer 1092-1*a* may be made of the same material on the same layer as the light shielding layer LS. Also, the second conductive layer 1092-1*b* may be made of the same material on the same layer as the gate line GL and the sensing line SL. However, the present disclosure is not limited thereto. The first line pattern 1092-1 may be formed as a single layer depending on design choice.

The second line pattern 1092-2 of the second link line 1092 may be connected to the pad part P. Thus, the second line pattern 1092-2 may be disposed closer to an outer periphery of the display device 100 than the first line pattern 1092-1 and the third line pattern 1092-3. The second line pattern 1092-2 may be disposed on the same layer as the first line pattern 1092-1.

The second line pattern 1092-2 of the second link line 1092 may include a plurality of conductive layers. For example, as shown in FIG. 11, the second line pattern 1092-2 may include a first conductive layer 1092-2*a* and a second conductive layer 1092-2*b* disposed on the first conductive layer 1092-2*a* so as to be in contact with the first conductive layer 1092-2*a*. The first conductive layer 1092-2*a* may be made of the same material on the same layer as the light shielding layer LS. Also, the second conductive layer 1092-2*b* may be made of the same material on the same layer as the gate line GL and the sensing line SL. However, the present disclosure is not limited thereto. The second line pattern 1092-2 may be formed as a single layer depending on design choice.

The third line pattern 1092-3 may be disposed on the first line pattern 1092-1 and the second line pattern 1092-2 of the second link line 1092. The third line pattern 1092-3 may be disposed between the first line pattern 1092-1 and the second line pattern 1092-2 of the second link line 1092 to connect the first line pattern 1092-1 and the second line pattern 1092-2.

The third line pattern 1092-3 of the second link line 1092 may overlap the tip end of the second substrate 140. That is, as shown in FIG. 10 and FIG. 11, only the third line pattern 1092-3 among the first line pattern 1092-1, the second line pattern 1092-2, and the third line pattern 1092-3 is disposed to overlap the tip end of the second substrate 140. The first line pattern 1092-1 and the second line pattern 1092-2 may not overlap the tip end of the second substrate 140.

Meanwhile, referring to FIG. 10 and FIG. 11, the lower buffer layer 1016, the upper buffer layer 1011, the gate insulating layer 1012, and the first passivation layer 1013 may be disposed except an area where the third line pattern 191-3 of the first link line 191 overlaps the tip end of the second substrate 140. Also, the lower buffer layer 1016, the upper buffer layer 1011, the gate insulating layer 1012, and the first passivation layer 1013 may be disposed except an area where the third line pattern 1092-3 of the second link line 1092 overlaps the tip end of the second substrate 140. For example, as shown in FIG. 11, the lower buffer layer 1016, the upper buffer layer 1011, and the gate insulating layer 1012 may not be disposed in an area Y where the tip end of the second substrate 140 is disposed. Also, the first passivation layer 1013 may be disposed to cover side surfaces of the lower buffer layer 1016, the upper buffer layer 1011, the gate insulating layer 1012, the first line pattern 191-1 and the second line pattern 191-2 of the first link line 191, and the first line pattern 1092-1 and the second line pattern 1092-2 of the second link line 1092. Thus, the first passivation layer 1013 may not be disposed in the area Y. That is, the plurality of inorganic insulating layers may be disposed except an area between the plurality of first link lines 191.

Thus, the first substrate 101 may be exposed in the area Y by the lower buffer layer 1016, the upper buffer layer 1011, the gate insulating layer 1012, and the first passivation layer 1013.

The filling layer 1080 may be disposed between the third line pattern 191-3 of the first link line 191 and between the third line pattern 1092-3 of the second link line 1092 and the first substrate 101.

The filling layer 1080 may be disposed at an area where the plurality of inorganic insulating layers is removed in an area overlapping the tip end of the second substrate 140. Thus, the first passivation layer 1013 may be in contact with a side surface of the filling layer 1080. Also, the filling layer 1080 may be disposed on the first substrate 101 whose one surface is exposed between the first line pattern 191-1 and the second line pattern 191-2 of the first link line 191. Further, the filling layer 1080 may be disposed on the first substrate 101 whose one surface is exposed between the first line pattern 1092-1 and the second line pattern 1092-2 of the second link line 1092. Thus, the filling layer 1080 may be disposed to overlap the third line pattern 191-3 of the first link line 191 and the third line pattern 1092-3 of the second link line 1092.

The filling layer 1080 may be made of an organic insulating material. This is to suppress the occurrence of cracks in the third line pattern 191-3 of the first link line 191 and the third line pattern 1092-3 of the second link line 1092 disposed thereon. Also, this is to dispose the third line pattern 191-3 of the first link line 191 and the third line pattern 1092-3 of the second link line 1092 on a flat surface.

Thus, in the display device 1000 according to yet another example embodiment of the present disclosure, the placement of the plurality of inorganic insulating layers on one side of the non-active area NA on which the plurality of pad parts P connected to the flexible film 160 is disposed may be minimized. For example, the plurality of inorganic insulating layers may not be disposed in an area overlapping the tip end of the second substrate 140 between the plurality of pad parts P. Therefore, the inorganic insulating layers are removed from a position where a stress is applied and cracks are highly likely to occur. Thus, it is possible to reduce the occurrence of cracks in an outer peripheral portion of the display device 1000 and suppress a driving error of the display device 1000. Accordingly, it is possible to improve the reliability of the display device 1000.

Further, in the display device 1000 according to yet another example embodiment of the present disclosure, the filling layer 1080 instead of the inorganic insulating layers is disposed under the plurality of link lines 1090. The plurality of link lines 1090 overlaps the tip end of the second substrate 140. Thus, it is possible to suppress the occurrence of cracks in the plurality of link lines 1090. For example, the filling layer 1080 instead of the inorganic insulating layers is disposed under the third line pattern 191-3 of the first link line 191 and the third line pattern 1092-3 of the second link line 1092. Thus, it is possible to suppress the occurrence of cracks in the third line pattern 191-3 of the first link line 191 and the third line pattern 1092-3 of the second link line 1092.

Furthermore, in the display device 1000 according to yet another example embodiment of the present disclosure, the filling layer 1080 instead of the inorganic insulating layers is disposed under the third line pattern 191-3 of the first link line 191 and the third line pattern 1092-3 of the second link line 1092. The third line pattern 191-3 of the first link line 191 and the third line pattern 1092-3 of the second link line 1092 overlap the tip end of the second substrate 140. Thus, it is possible to suppress the occurrence of cracks in the third line pattern 191-3 of the first link line 191 and the third line pattern 1092-3 of the second link line 1092.

The example embodiments of the present disclosure can also be described as follows:

According to an aspect of the present disclosure, there is provided a display device. The display device comprises a first substrate which includes an active area with a plurality of sub-pixels and a non-active area enclosing the active area and is made of one of transparent conductive oxides or oxide semiconductors, a plurality of signal lines disposed on the first substrate, a pad part disposed on the first substrate in the non-active area, a plurality of link lines which connects the pad part and the plurality of signal lines, a plurality of inorganic insulating layers disposed between the first substrate and the plurality of link lines; and a second substrate disposed on the first substrate and the plurality of link lines, wherein a plurality of first link lines among the plurality of link lines includes a first line pattern connected to the plurality of signal lines, a second line pattern connected to the pad part; and a third line pattern which connects the first line pattern and the second line pattern of the first link line and overlaps a tip end of the second substrate, and the plurality of inorganic insulating layers is disposed except an area where the tip end of the second substrate overlaps the third line pattern of the first link line.

The first line pattern and the second line pattern of the first link line may be disposed on the same layer as at least one of the plurality of signal lines, and the third line pattern of the first link line may be disposed on the first line pattern and the second line pattern of the first link line.

The display device may further comprise a filling layer disposed between the third line pattern of the first link line and the first substrate.

The filling layer may be made of an organic insulating material.

The display device may further comprise a color filter disposed in the active area, wherein the filling layer may be made of the same material as the color filter.

The plurality of inorganic insulating layers may include a first passivation layer disposed on the first line pattern and the second line pattern of the first link line, and the first passivation layer may be in contact with a side surface of the filling layer.

The plurality of first link lines may be connected to a pad electrode located at two tip ends of the pad part.

Each of the plurality of first link lines may be connected to one of the plurality of signal lines to which a constant voltage is applied, or one of dummy lines.

The plurality of link lines may include a plurality of second lines disposed between the plurality of first link lines.

The plurality of inorganic insulating layers may be disposed in all of areas where the plurality of second link lines is disposed.

The plurality of second lines may have a smaller width than the plurality of first link lines.

The plurality of second lines may include a first line pattern connected to the plurality of signal lines, a second line pattern connected to the pad part, and a third line pattern which may connect the first line pattern and the second line pattern of the second link line and overlap the tip end of the second substrate, and the plurality of inorganic insulating layers may be disposed except an area where the tip end of the second substrate overlaps the third line pattern of the second link line.

The plurality of inorganic insulating layers may be disposed except an area between the plurality of first link lines.

The plurality of second link lines may have the same width as the plurality of first link lines.

The pad part may be provided in plurality, and the plurality of inorganic insulating layers may be disposed except an area between the plurality of pad parts.

According to another aspect of the present disclosure, there is provided a display device. The display device comprises a first substrate which includes an active area and a non-active area enclosing the active area and is made of one of transparent conductive oxides or oxide semiconductors, a plurality of signal lines disposed on the first substrate in the active area, a plurality of link lines connected to the plurality of signal lines and disposed extending to the non-active area, a pad part connected to the plurality of link lines in the non-active area, a plurality of inorganic insulating layers disposed to overlap the plurality of link lines on the first substrate, a second substrate disposed on the first substrate, and a filling layer disposed in an area overlapping a tip end of the second substrate on the first substrate, wherein a plurality of first link lines among the plurality of link lines includes a first line pattern disposed adjacent to the active area, a second line pattern spaced apart from the first line pattern and disposed close to an outer periphery of the first substrate; and a third line pattern which connects the first line pattern and the second line pattern of the first link line, and the filling layer is disposed in an area where the tip end of the second substrate overlaps the third line pattern of the first link line.

The plurality of inorganic insulating layers may include a first passivation layer disposed on the first line pattern and the second line pattern of the first link line, and the third line pattern of the first link line may be disposed on the first passivation layer and connect the first line pattern and the second line pattern of the first link line through a contact hole in the first passivation layer.

The filling layer may be disposed under the third line pattern of the first link line and have a flat upper surface.

The filling layer may be disposed to be enclosed by the third line pattern of the first link line, the first passivation layer, and the first substrate.

The plurality of first link lines may be connected to a pad electrode located at two tip ends of the pad part.

The plurality of link lines may further include a plurality of second lines having the same width as the plurality of first link lines, and the plurality of second lines may include a first line pattern disposed adjacent to the active area, a second line pattern spaced apart from the first line pattern of the second link line and disposed close to an outer periphery of the first substrate, and a third line pattern disposed between the first line pattern and the second line pattern of the second link line, and the filling layer may be disposed in an area where the tip end of the second substrate overlaps the third line pattern of the second link line.

Although the example embodiments of the present disclosure have been described in detail with reference to the accompanying drawings, the present disclosure is not limited thereto and may be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   a first substrate which includes an active area having a plurality of sub-pixels and a non-active area;
   a plurality of signal lines disposed on the first substrate in the active area;
   a pad part disposed on the first substrate in the non-active area;
   a plurality of link lines which connects the pad part and the plurality of signal lines and each extends to the non-active area;

a plurality of inorganic insulating layers disposed between the first substrate and the plurality of link lines and overlapping the plurality of link lines on the first substrate;
   a second substrate disposed on the first substrate and the plurality of link lines; and
   a filling layer disposed on the first substrate,
   wherein a plurality of first link lines among the plurality of link lines each includes:
      a first line pattern connected to the plurality of signal lines and adjacent to the active area;
      a second line pattern connected to the pad part and spaced apart from the first line pattern and disposed close to an outer periphery of the first substrate; and
      a third line pattern which connects the first line pattern and the second line pattern and overlaps a tip end of the second substrate, and
      wherein each layer in the plurality of inorganic insulating layers is offset from an area where the tip end of the second substrate overlaps the third line pattern of the first link line,
      wherein the first substrate includes one or more of a transparent conductive oxide or an oxide semiconductor,
      wherein the filling layer is disposed in an area overlapping a tip end of the second substrate,
      wherein the plurality of inorganic insulating layers includes a first passivation layer disposed on the first line pattern and the second line pattern of the first link line, and
      wherein the third line pattern of the first link line is disposed on the first passivation layer and connects the first line pattern and the second line pattern of the first link line each through a contact hole in the first passivation layer.

2. The display device according to claim 1, wherein the first line pattern and the second line pattern are disposed on a same layer as at least one of the plurality of signal lines, and
   the third line pattern of the first link line is disposed on the first line pattern and the second line pattern.

3. The display device according to claim 1, wherein the filling layer disposed between the third line pattern and the first substrate.

4. The display device according to claim 3, wherein the filling layer includes an organic insulating material.

5. The display device according to claim 3, further comprising:
   a color filter disposed in the active area,
   wherein the filling layer includes a same material as the color filter.

6. The display device according to claim 3, wherein the first passivation layer is in contact with a side surface of the filling layer.

7. The display device according to claim 1, wherein the plurality of first link lines are each connected to a pad electrode located at a tip end of the pad part.

8. The display device according to claim 7, wherein each of the plurality of first link lines is connected to one of the plurality of signal lines that are configured to receive a constant voltage, or is connected to one of dummy lines.

9. The display device according to claim 7, wherein the plurality of link lines includes a plurality of second link lines disposed between the plurality of first link lines.

10. The display device according to claim 9, wherein the plurality of inorganic insulating layers is disposed in all of areas where the plurality of second link lines are disposed.

11. The display device according to claim 9, wherein the plurality of second link lines each has a smaller width than each of the plurality of first link lines.

12. The display device according to claim 9, wherein the plurality of second link lines each includes:

a first line pattern connected to the plurality of signal lines;

a second line pattern connected to the pad part; and a third line pattern that connects the first line pattern and the second line pattern of the second link line and overlaps the tip end of the second substrate, and the plurality of inorganic insulating layers is offset from an area where the tip end of the second substrate overlaps the third line pattern of the plurality of second link lines.

13. The display device according to claim 12, wherein the plurality of inorganic insulating layers is disposed except an area between third line patterns of two adjacent first link lines among the plurality of first link lines.

14. The display device according to claim 12, wherein the plurality of second link lines each has a same width as each of the plurality of first link lines.

15. The display device according to claim 1, wherein the pad part includes a plurality of pad parts, and the plurality of inorganic insulating layers are disposed in all areas except an area between the plurality of pad parts.

16. A display device, comprising:

a first substrate which includes an active area and a non-active area and includes one or more of a transparent conductive oxide or an oxide semiconductor;

a plurality of signal lines disposed on the first substrate in the active area;

a plurality of link lines connected to the plurality of signal lines and disposed extending to the non-active area;

a pad part connected to the plurality of link lines in the non-active area;

a plurality of inorganic insulating layers disposed to overlap the plurality of link lines on the first substrate;

a second substrate disposed on the first substrate; and a filling layer disposed on the first substrate, wherein a first link line of a plurality of first link lines among the plurality of link lines includes:

a first line pattern disposed adjacent to the active area;

a second line pattern spaced apart from the first line pattern and disposed close to an outer periphery of the first substrate; and a third line pattern which connects the first line pattern and the second line pattern of the first link line, and wherein the filling layer is disposed in an area overlapping a tip end of the second substrate, the tip end of the second substrate overlapping the third line pattern of the first link line, wherein the plurality of inorganic insulating layers includes a first passivation layer disposed on the first line pattern and the second line pattern of the first link line, and the third line pattern of the first link line is disposed on the first passivation layer and connects the first line pattern and the second line pattern of the first link line each through a contact hole in the first passivation layer.

17. The display device according to claim 16, wherein the filling layer is disposed under the third line pattern of the first link line and has a flat upper surface.

18. The display device according to claim 16, wherein the filling layer is enclosed by the third line pattern of the first link line, the first passivation layer, and the first substrate.

19. The display device according to claim 16, wherein the plurality of first link lines are each connected to a pad electrode located at a tip end of the pad part.

20. The display device according to claim 16, wherein the plurality of link lines further includes a plurality of second link lines each having a same width as the first link line, and the plurality of second link lines each includes:

a first line pattern disposed adjacent to the active area;

a second line pattern spaced apart from the first line pattern of the second link line and disposed close to an outer periphery of the first substrate; and a third line pattern disposed between the first line pattern and the second line pattern of the second link line, and the filling layer is disposed in an area where the tip end of the second substrate overlaps the third line pattern of the second link line.

21. A display device, comprising:

a first substrate;

inorganic insulation layers on the first substrate, the inorganic insulation layers including a hole that exposes the first substrate;

a first line pattern and a second line pattern on the inorganic insulation layers and each being offset from the hole;

a third line pattern in contact with each of the first line pattern and the second line pattern and overlapping the hole;

a second substrate on the first line pattern and the third line pattern; and a first passivation layer on the first line pattern and the second line pattern, the first passivation layer in contact with the first substrate in the hole, and the edge of the second substrate being offset from the first passivation layer, wherein, an edge of the second substrate overlaps the hole, and wherein the first substrate includes one or more of a transparent conductive oxide or an oxide semiconductor.

22. The display device of claim 21, wherein the third line pattern is in contact with the first line pattern and the second line pattern through a hole in the first passivation layer.

* * * * *